United States Patent
Parra Vilchis et al.

(10) Patent No.: US 10,763,868 B2
(45) Date of Patent: Sep. 1, 2020

(54) DECENTRALIZED SYNCHRONIZATION OF MULTIPLE AGENTS

(71) Applicant: Intel Corporation, Santa Clara, CA (US)

(72) Inventors: Jose I. Parra Vilchis, Jalisco (MX); Anthony K. Guzman Leguel, Jalisco (MX); David Gomez Gutierrez, Jalisco (MX); Leobardo E. Campos Macias, Jalisco (MX); Rafael de la Guardia Gonzalez, Jalisco (MX); Rodrigo Aldana Lopez, Jalisco (MX)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/457,779

(22) Filed: Jun. 28, 2019

(65) Prior Publication Data

US 2019/0326916 A1    Oct. 24, 2019

(51) Int. Cl.
*H03L 7/099* (2006.01)
*H04L 29/08* (2006.01)
*H04J 3/06* (2006.01)
*G06F 1/10* (2006.01)

(52) U.S. Cl.
CPC .............. *H03L 7/0991* (2013.01); *G06F 1/10* (2013.01); *H04J 3/0697* (2013.01); *H04L 67/1059* (2013.01)

(58) Field of Classification Search
CPC . H03L 7/0991; H03L 7/00; G06F 1/10; G06F 11/00; G06F 13/40; H04J 3/0697; H04L 67/1059; H04L 69/40

USPC .......................................... 375/356; 714/724
See application file for complete search history.

(56) References Cited

U.S. PATENT DOCUMENTS

| | | | |
|---|---|---|---|
| 9,952,620 B2 | 4/2018 | Gutierrez et al. | |
| 2005/0113973 A1* | 5/2005 | Endo | B25J 13/08 700/245 |
| 2009/0013224 A1* | 1/2009 | Ziaja | G06F 11/2236 714/724 |

OTHER PUBLICATIONS

Gummesson, Filip et al., "Masters Thesis, Time Synchronization in Short Range Wireless Networks," Department of Electrical and Information Technology, Faculty of Engineering, LTD, Lund University, 2016 (65 pages).

(Continued)

*Primary Examiner* — Fitwi Y Hailegiorgis
(74) *Attorney, Agent, or Firm* — Alliance IP, LLC

(57) ABSTRACT

In one embodiment, a distributed oscillator computes a first error value based on a first state value for the distributed oscillator and first state values for other distributed oscillators, and computes a second error value based on a second state value for the distributed oscillator and second state values for the other distributed oscillators. The distributed oscillator computes a new first state value for the distributed oscillator based on the first error value, the first state value for the distributed oscillator, and the second state value for the distributed oscillator, and computes a new second state value for the distributed oscillator based on the second error value, the first state value for the distributed oscillator, and the second state value for the distributed oscillator. The distributed oscillator transmits the new first state value and the new second state value to the other distributed oscillators.

20 Claims, 14 Drawing Sheets

(56) References Cited

OTHER PUBLICATIONS

McElroy, Ciaran et al., "Comparison of Wireless Clock Synchronization Algorithms for Indoor Location Systems," ICC'14—W10: Workshop on Advances in Network Localization and Navigation, IEEE (2014) (6 pages).

Tiemann, Janis et al., "ATLAS—An Open-Source TDOA-based Ultra-Wideband Localization System," TU Dortmund University, Communication Networks Institute (CNI), Dortmund, Germany, IEEE (2016) (6 pages).

* cited by examiner

DECENTRALIZED SYNCHRONIZATION OF MULTIPLE AGENTS

TECHNICAL FIELD

This disclosure relates in general to the field of computer systems and, more particularly, to decentralized synchronization of agents in a multi-agent system.

BACKGROUND

Multi-agent systems include loosely coupled intelligent agents deployed in an environment that interact with one another and/or make decisions based on the actions of or information from the other agents. The agents in these multi-agent systems applications may accordingly need to synchronize their actions, sensing, or timestamps with one another. For example, autonomous cars must synchronize in order to coexist and cooperate with each other in the streets. As another example, the creation of immersive experiences based on multiple moving cameras may need synchronized frames, and thus, may require each camera to synchronize with one another (sometimes without being connected to the same compute system).

Centralized schemes for synchronization of multiple agents may be undesirable due to the single point of failure. In addition, centralized schemes may be undesirable in widely distributed systems, such as in swarm systems where the collective would need more than one node due to local communication ranges. For instance, such schemes may fail in big and/or dense cities with buildings and structures blocking a centralized synchronization signal (e.g., a GPS signal that might be used for global synchronization) for certain critical periods of time.

Accuracy of software-based synchronization algorithms may vary due to unknown time delays between the application layer and the physical layer (e.g., transceivers), and without specialized hardware, accuracy may be limited. Further, in wireless communication systems, high bandwidth may be needed to achieve high-accuracy synchronization.

BRIEF DESCRIPTION OF THE DRAWINGS

Like reference numbers and designations in the various drawings indicate like elements.

DETAILED DESCRIPTION OF EXAMPLE EMBODIMENTS

Figure 1:
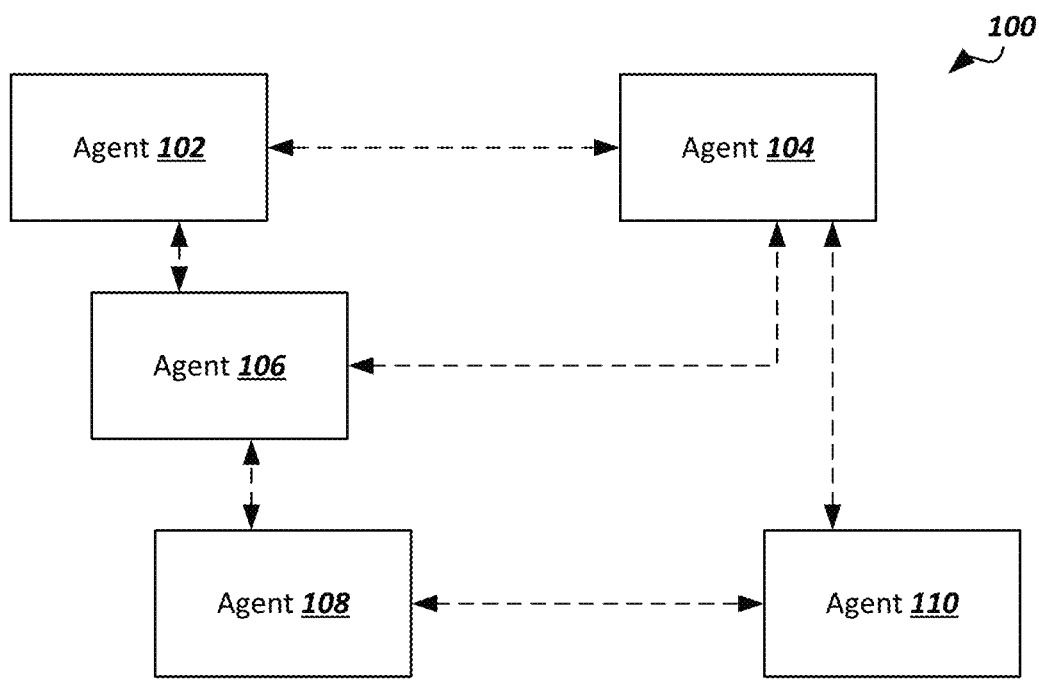
FIG. 1 is a simplified block diagram of an example multi-agent system.

Agents in multi-agent systems applications may need to synchronize their actions, sensing, or timestamps with one another. For example, autonomous cars must synchronize in order to coexist and cooperate with each other in the streets. As another example, the creation of immersive experiences based on multiple moving cameras may need synchronized frames, and thus, may require each camera to synchronize with one another (sometimes without being connected to the same compute system).

Some previous solutions for synchronization include: Network Time Protocol (NTP), Precision Time Protocol (PTP), reference broadcast synchronization (RBS), Time-sync protocol for sensor networks (TPSN), Flooding time synchronization protocol (FTSP). These algorithms mostly work by timestamping communication packages and synchronizing those timestamps. Some of them synchronize to a server considered to be already synchronized or they may synchronize to a central node. Other time synchronization algorithms may use PD, PID, PII control systems to synchronize to a centralized node.

However, such centralized synchronization schemes may be undesirable. For instance, a centralized synchronization scheme provides a single point of failure. In addition, centralized schemes may be undesirable in widely distributed systems, such as in swarm systems where the collective would need more than one node due to local communication ranges. For instance, such schemes may fail in big and/or dense cities with buildings and structures blocking a centralized synchronization signal (e.g., a GPS signal that might be used for global synchronization) for certain critical periods of time. Moreover, timestamp-based synchronization includes issues related to the management of skew and drift of the clocks. Since all clocks are located on different systems, the velocity and acceleration of the clock may vary due to different reasons (e.g. temperature). Further, software-based algorithms for synchronization present extra levels of uncertainty. And some software-based implementations without specialized clock hardware with desired precision (such as RTCs) will need high bandwidth.

Accordingly, aspects of the present disclosure include decentralized synchronization schemes for multi-agent systems that are based on dynamic system oscillators implemented in hardware. In some instances, such schemes may guarantee robustness when communication packages are lost or when using low frequency local communication between agents. In addition, the proposed schemes may provide robust timestamp creation from the phase of the synchronized oscillator, the creation of a synchronized output trigger signal which can be used in different applications, and the protocol/automata to enable robustness and synchronization integrity when adding or losing agents. In addition, the proposed hardware implementations can be used as a peripheral that may be connected to a communication transceiver, with trigger signals being connected to intended sensor/applications, enabling synchronized sensing/actuation in autonomous cars, mobile robots, or other types of multi-agent systems. For example, aspects of the present disclosure may be advantageous in at least two important scenarios: (1) platoons and formations between multiple cars at high velocities, and (2) cooperative reconstruction of maps of the environment for planning and description taking in autonomous cars. Both scenarios require precise synchronization between agents to coordinate their motion and data acquisition.

One or more aspects of the present disclosure may be implemented in important use cases, such as distributed planning and cooperation of autonomous cars, wireless camera arrays (e.g., distributed environment reconstruction in autonomous cars or camera drones), and Ultra-Wide Band (UWB) localization for mobile robotics. The latter use case in particular may require picoseconds accuracy in the synchronization for multiple beacons which may be non-stationary, spread over a large area and subject to non-line of sight between pairs of beacons. The schemes proposed herein may enable fully distributed synchronization for all beacons with the picosecond accuracy required for UWB localization, without the need of centralized nodes.

The present disclosure describes certain techniques, which are based on dynamic system oscillators, that include the architecture needed to run the decentralized synchronization algorithm, the algorithm extension to create robust timestamps based on the phase of the synchronized oscillator, synchronized trigger signals, and the protocol/automata to enable robustness in presence of dynamic connections (such as adding or losing agent connections). These techniques may provide one or more advantages, in some cases. For instance, because the scheme is decentralized, there is robustness with respect to a single point of failure. Also, no central synchronization beacons/server are required. In addition, synchronized oscillator waveforms, triggers, and timestamps may be generated using the described techniques. New agents may also be securely aggregated into multi-agent systems without affecting the synchronization of the agents. Timestamps generated by the described techniques may be robust against clock skew and drift due to being generated from the oscillator phase instead of a timer, and synchronization may be robust against high packet error rate. Furthermore, the techniques may use less bandwidth and provide higher precision in comparison to software-based implementations. Additionally, the hardware implementations described can be used as a peripheral connected directly to sensors or actuators.

Turning to FIG. 1, a simplified block diagram of an example multi-agent system 100 is shown. As used herein, a multi-agent system may refer to a system that includes loosely coupled intelligent agents deployed in an environment that interact with one another and/or make decisions based on the actions of or information from the other agents. An agent may be implemented in hardware, software, or a combination thereof. Loosely coupled may refer to agents being communicably coupled with one another generally, such that they may receive data from the other agents while not being communicably coupled directly to each of the other agents (e.g., as shown in FIG. 1). Examples of multi-agent system include deployments of autonomous vehicles (e.g., swarms of autonomous vehicles interacting with one another and making decisions based on the actions of one another) and multi-robot systems (e.g., UWB robotics applications). The agents of a multi-agent system may work to achieve a common goal (e.g., safely providing transportation in an autonomous vehicle application). Each agent in a multi-agent system may have autonomy. For instance, in many cases, no agent in a multi-agent system may be designated as a controlling agent for the other agents. Further, each agent may have limited perspective into the environment in which it is deployed. In certain systems, the agents may self-direct and self-organize.

The example multi-agent system 100 includes agents 102, 104, 106, 108, 110 in an environment. Each agent is communicably coupled directly to at least one other agent in the system 100 through a wired or wireless communication link, and may be communicably coupled indirectly to the other remaining agents in the system 100 via the direct connections. For example, agent 102 is directly coupled to agents 104, 106, but may be indirectly coupled to the other agents in the system 100 through the connections with agents 104, 106 (e.g., as described below with respect to FIG. 6). The agents in the system 100 may be distributed in the environment at various distances from one another.

Figure 2:
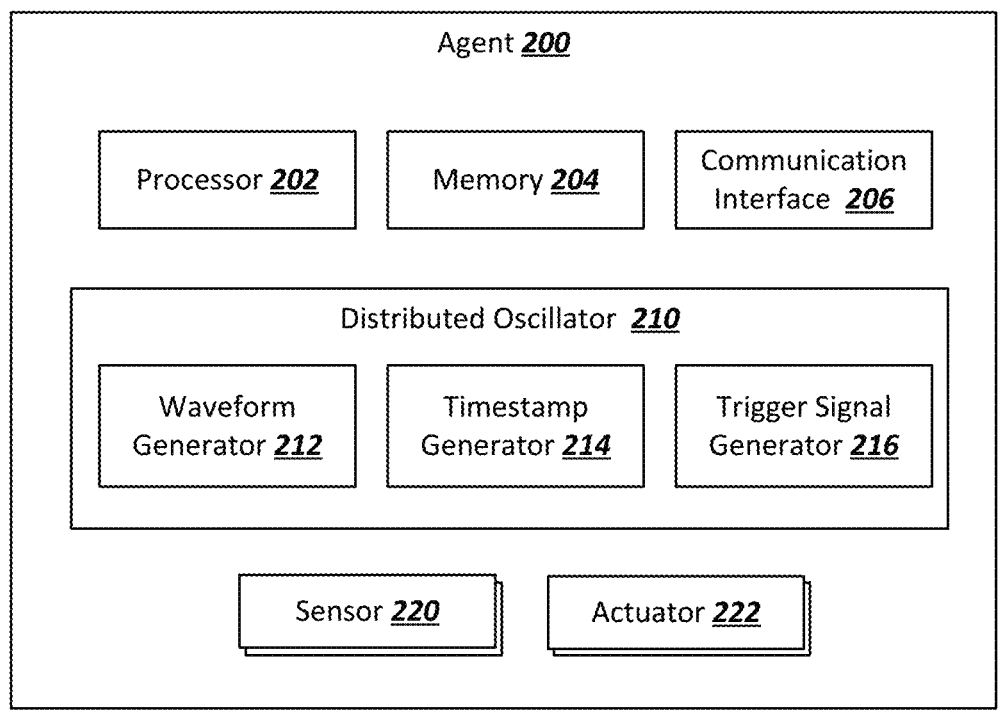
FIG. 2 is a simplified block diagram of an example agent in a multi-agent system.

FIG. 2 is a simplified block diagram of an example agent 200 in a multi-agent system. In the example shown, the example agent 200 includes a processor 202, memory 204, and a communication interface 206. The example processor 202 executes instructions, for example, to perform one or more of the functions of the agent 200. The instructions can include programs, codes, scripts, or other types of data stored in memory 204. Additionally, or alternatively, the instructions can be encoded as pre-programmed or re-programmable logic circuits, logic gates, or other types of hardware or firmware components. The processor 202 may be or include a general-purpose microprocessor, as a specialized co-processor or another type of data processing apparatus. In some cases, the processor 202 may be configured to execute or interpret software, scripts, programs, functions, executables, or other instructions stored in the memory 204. In some instances, the processor 202 includes multiple processors or data processing apparatuses.

The example memory 204 includes one or more computer-readable media. For example, the memory 204 may include a volatile memory device, a non-volatile memory device, or a combination thereof. The memory 204 can include one or more read-only memory devices, random-access memory devices, buffer memory devices, or a combination of these and other types of memory devices. The memory 204 may store instructions (e.g., programs, codes, scripts, or other types of executable instructions) that are executable by the processor 202.

The example communication interface 206 includes circuitry to provide communication between the agent 200 and other agents in the multi-agent system (e.g., to communicate oscillator state values to the other agents, as described below). The communication interface 206 may include a wireless network interface or a wired network interface. For example, the network interface 206 may include hardware that implements wireless communication using one or more technologies (e.g., IEEE 802.11 communications (e.g., WiFi), cellular data networks (e.g., 3rd Generation Partnership Project (3GPP) networks, Global System for Mobile Communication (GSM), general packet radio service, code division multiple access (CDMA), etc.), Bluetooth, millimeter wave (mmWave), ZigBee, Z-Wave, etc.).

The agent 200 further includes a distributed oscillator 210, which includes a waveform generator 212, a timestamp generator 214, and a trigger signal generator 216. In some embodiments, the distributed oscillator 210 may be implemented similar to the distributed oscillator 300 of FIG. 3. The distributed oscillator 210 may include hardware to implement a particular oscillator type, such as, for example, an Andronov-based oscillator or a Van der Pol-based oscillator. As an example, the distributed oscillator 210 may include multiple oscillator circuits, with each oscillator circuit corresponding to a state value for the distributed oscillator 210. The state values may be associated with a set of equations based on a particular oscillator type implemented by the distributed oscillator 210. The distributed oscillator 210 may use the state values to generate an oscillator waveform that is used by the agent 200 to generate timestamps, trigger signals, or for another purpose. The state values, and thus the oscillator waveform, may be updated periodically as described herein. The oscillator waveform may be generated by circuitry within the oscillator waveform generator 212, timestamps may be generated by circuitry within the timestamp generator 214, and trigger signals may be generated by circuitry within the trigger signal generator 216. In some embodiments, the timestamps may be based on a phase of the oscillator waveform, while in some embodiments, the trigger signals may be based on a zero-cross detection of the oscillator waveform. Although the waveform generator 212, timestamp generator 214, and trigger signal generator 216 are shown as separate modules within the distributed oscillator 210, they may be implemented in another manner (e.g., external to the distributed oscillator 210 or in a single module within the distributed oscillator 210).

The agent 200 further includes a set of sensors 214 and a set of actuators 216. The sensors 214 may collect data for use by the agent 200, by another agent in the system, or by another entity. For example, the sensors 214 may include one or more of cameras, light sensors, temperature sensors, position sensors, or other types of sensors. The actuators 216 may be used to control one or more aspects of the agent 200. For example, the actuators 216 may include an electrical switch, a motor, a pneumatic device, or other types of actuators. In some instances, one or more of the sensors 214 or actuators 216 may utilize timestamps generated by the distributed oscillator 210 (e.g., timestamping data collected by a sensor), or may utilize trigger signals generated by the distributed oscillator 210 (e.g., performing an action based on a received trigger signal).

In some embodiments, the distributed oscillator 210 uses at least two state values that change according to a dynamical algorithm. Most types of oscillators utilize the same set of equations, which are expressed as the following in continuous time:

$$\dot{x}_1 = f_1(x_1, x_2)$$

$$\dot{x}_2 = f_2(x_1, x_2)$$

The distributed oscillator may accordingly have the property that, after a certain amount of time, $x_1$ and $x_2$ have a periodic oscillator behavior (e.g., in Van der pool-based or Andronov-based oscillators). To synchronize multiple oscillators in a multi-agent system, a control term $u_i$ may be added as shown below:

$$\dot{x}1 = f_1(x_1, x_2) + u_1$$

$$\dot{x}_2 = f_2(x_1, x_2) + u_2$$

Where $u_1 = k_1 e_1$ and $u_2 = k_2 e_2$, with $e_i$ representing a respective error value for the distributed oscillator and $k_i$ being a constant. The error value $e_1$ may indicate an error between the first state value for the distributed oscillator and the first state values for the other distributed oscillators in the system, and the error value $e_2$ may indicate an error between the second state value for the distributed oscillator and the second state values for the other distributed oscillators in the system. For example if an agent X is currently connected to agents Y and Z, then $e_1 = (x_1 - y_1) + (x_1 - z_1)$ and $e_2 = (x_2 - y_2) + (x_2 - z_2)$, where $x_1$ is the first state value for the agent X, $x_2$ is the second state value for the agent X, $y_1$ is the first state value for the agent Y, $y_2$ is the second state value for the agent Y, $z_1$ is the first state value for the agent Z, and $z_2$ is the second state value for the agent Z. In discrete time with a time step $\Delta t$, this can be expressed as:

$$x_1[n+1] = x_1[n] + \Delta t(f_1(x_1, x_2) + u_1[n])$$

$$x_2[n+1] = x_2[n] + \Delta t(f_2(x_1, x_2) + u_2[n])$$

Or as $$x_1[n+1] = \hat{f}(x_1[n], x_2[n], u_i[n])$$

$$x_2[n+1] = \hat{f}_2(x_1[n], x_2[n], u_i[n])$$

Where $\hat{f}_i(x_1[n], x_2[n], u_i[n]) = x_i[n] + \Delta t(f_i(x_1, x_2) + u_i[n])$.

Timestamps may be generated based on the state values for the oscillator. In particular, in some embodiments, timestamps may be generated based on a phase of the waveform generated using the state values. As an example, an Andronov-based oscillator is expressed in the following equations:

$$\dot{x}_1 = -x_2 + x_1(\beta^2 - (x_1^2 + x_2^2))$$

$$\dot{x}_2 = w^2 x_1 + x_2(\beta^2 - (x_1^2 + x_2^2))$$

Where $\omega = 2\pi f$ is the angular frequency of the response and the amplitude of the response is $\beta$. After a certain amount of time, the states will behave as:

$$x_1 = \sin(2\pi ft)$$

$$x_2 = 2\pi f \cos(2\pi ft)$$

Once the states are established, a timestamp may be obtained by the phase $\theta = 2\pi ft$. This can be retrieved using the angle between the vector $(x_1, (2\pi f)^{-1} x_2)$ and the horizontal axis. This angle only varies in the interval $(-\pi, \pi)$; however, the quantity $2\pi ft$ always increases. Therefore, an unwrapping procedure may be performed to obtain the angle. The unwrapping procedure may utilize a past value for the phase to know whether to leave the new phase value as it is, or to add or subtract $2\pi$. The past phase value may be taken from an external timestamp (a timestamp generated by another agent) when the current agent is in a listening mode (described further below) and may be taken from a local timestamp when the current agent is in a free transmission mode (also described further below).

Figure 3:
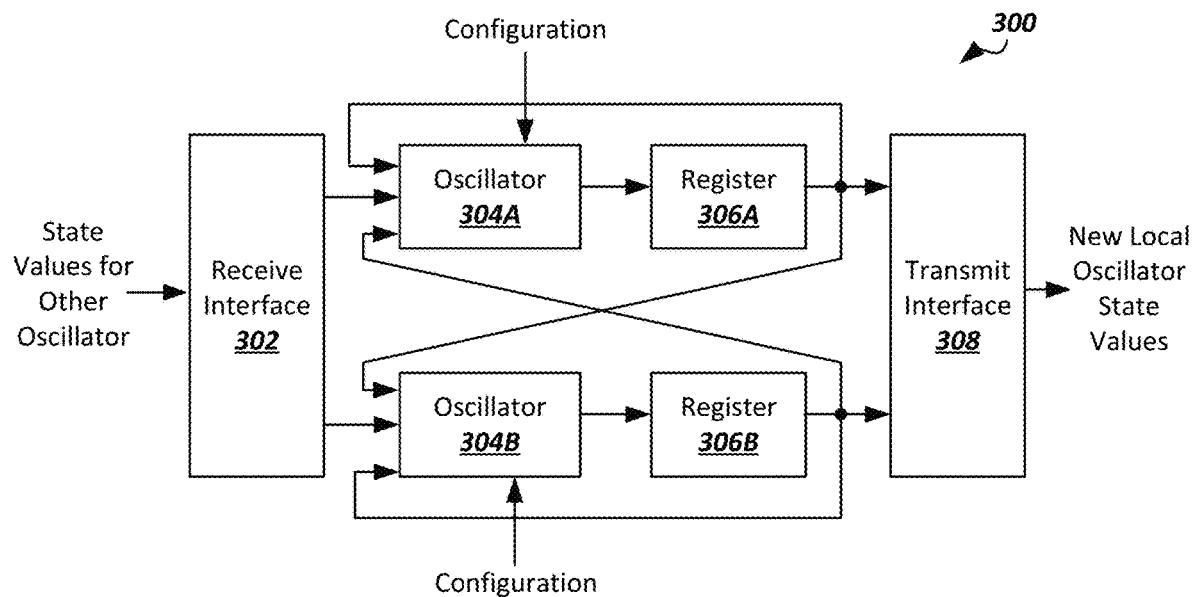
FIG. 3 is a simplified block diagram of an example distributed oscillator architecture.

FIG. 3 is a simplified block diagram of an example distributed oscillator architecture 300. The distributed oscillator architecture 300 may be implemented in an agent of a multi-agent system, such as in the distributed oscillator 210 of agent 200 of FIG. 2. The example distributed oscillator architecture 300 includes a receive interface 302, two oscillator circuits 304 and corresponding registers 306, and a transmit interface 308. Each oscillator circuit 304 may generate a respective state value for the distributed oscillator architecture 300. For instance, using the example described above where the distributed oscillator architecture 300 is implemented in agent X, the oscillator circuit 304A may generate the first state value $x_1$ and the oscillator circuit 304B may generate the first state value $x_2$. In certain embodiments, the state values may be generated by the respective oscillator circuits on each rising edge of an agent clock. In some embodiments, the oscillator circuits can have several configurable oscillator dynamics to implement different oscillators (e.g., an Andronov-based oscillator and a Van der Pol-based oscillator), and may select between different oscillator functions to implement the different respective oscillators.

The receive interface 302 may receive state values from distributed oscillators of other agents in a multi-agent system, and may compute error values associated with each state value received. For instance, using the example described above where the distributed oscillator architecture 300 is implemented in agent X, the receive interface 302 may receive first and second state variables $y_1$, $y_2$, respectively, from agent Y and first and second state variables $z_1$, $z_2$, respectively, from agent Z. The receive interface 302 may compute the error values $e_1$, $e_2$ based on the received state values and the state values $x_1$, $x_2$ for the distributed oscillator architecture 300.

Figure 4:
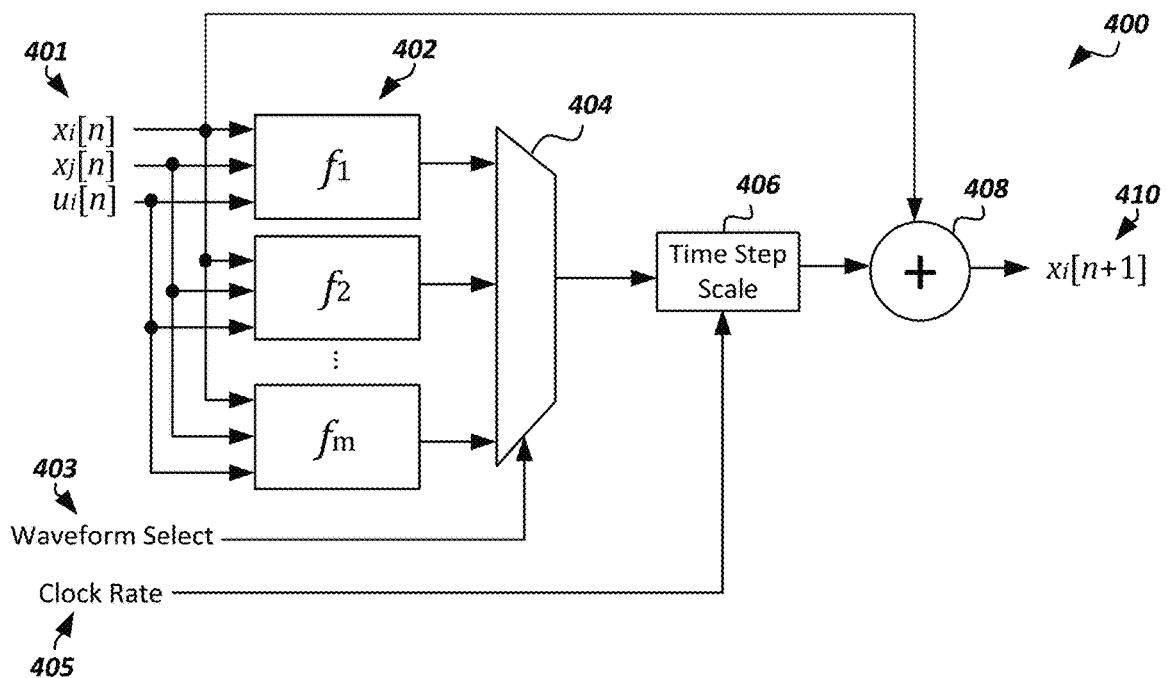
FIG. 4 is a simplified block diagram of an example oscillator circuit of a distributed oscillator.

Each oscillator circuit 304 receives the error values computed by the receive interface 302 and uses the error values to generate new state values for the oscillator. Each oscillator circuit 304 may include combinational components to encode the oscillator dynamics (Van der Pol, Andronov, etc.) that depend on the actual state values for the oscillator and the input state values received from other agents. In some embodiments, each oscillator circuit 304 may be implemented as shown in FIG. 4, and may implement the equation for $\hat{f}(x_1[n], x_2[n], u_i[n])$ described above. The example registers 306 store the state values generated by their corresponding oscillator circuits 304, and the transmit interface 308 accesses the stored state values and transmits the state values to other distributed oscillators in the multi-agent system.

FIG. 4 is a simplified block diagram of an example oscillator circuit 400 of a distributed oscillator. The example oscillator circuit 400 corresponds to a state value $x_i$ for the distributed oscillator to which the oscillator circuit belongs, and may implement an aspect of the function $x_i[n+1] = \hat{f}_i(x_1[n], x_2[n], u_i[n]) = x_i[n] + \Delta t(f_i(x_1, x_2) + u_i[n])$. For instance, in some embodiments, the example oscillator circuit 400 may be implemented in each of the oscillator circuits 304 of FIG. 3.

The example oscillator circuit 400 includes a set of combinational circuits 402 that each encode an oscillator type (e.g., a Van der Pol-based oscillator, or an Andronov-based oscillator), and implement an aspect of the function $\hat{f}_i(x_1[n], x_2[n], u_i[n])$. For instance, in the example shown, each combination circuit 402 may receive the inputs 401 ($x_1, x_2, u_i$) and apply the function ($f_i(x_1, x_2) + u_i[n]$) as described above, where $f_i(x_1, x_2)$ is based on the oscillator type implemented by the circuit 402. The oscillator circuit 400 also includes a multiplexer 404 that allows for the selection of the oscillator type (based on the waveform select input 403) that is to be implemented the oscillator circuit 400 (and thus, by the distributed oscillator to which the oscillator circuit 400 belongs). The output of the selected combinational circuit 402 is then provided to the time step scale circuit 406, which multiplies the output of the selected combinational circuit 402 by a time step $\Delta t$. The time step may be based on a clock rate input 405, in some cases. For instance, in the example shown, the time step $\Delta t$ is the inverse of the clock rate input 405. The clock rate may be provided by a component of an agent that implements the oscillator circuit 400 (e.g., a processor or clock chip of an agent). The result of the multiplication in the time step scale circuit 406 is then provided to an adder 408 that adds the input $x_i[n]$ to the output of the time step scale circuit 406 ($\Delta t(f_i(x_1, x_2) + u_i[n])$). The result is the output 410, which is the next state value $x_i[n+1]$ corresponding to the oscillator circuit 400.

Figure 5:
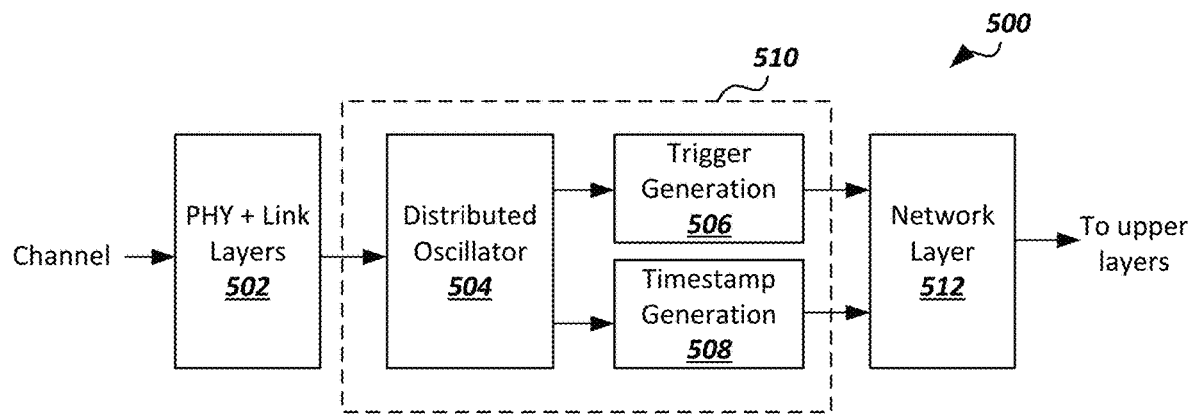
FIG. 5 is a simplified block diagram of a distributed oscillator implemented in the Open Systems Interconnection (OSI) model.

FIG. 5 is a simplified block diagram 500 of a distributed oscillator 504 implemented in the Open Systems Interconnection (OSI) model. In some embodiments, the distributed oscillator architecture 300 of FIG. 3 may fit inside the OSI model as shown. In the example shown, channel data is received and processed by the physical (PHY) and link layers 502, and then processed by the Distributed Synchronization Middle Layer (DSL) 510 before being passed to the network layer 512 and additional upper layers for further processing. The DSL 510 includes the distributed oscillator 504 (which may be implemented similar to the distributed oscillator architecture 300 of FIG. 3), along with a trigger generation module 506 (which may be implemented similar to the trigger signal generator 216 of FIG. 2) and a timestamp generation module 508 (which may be implemented similar to the timestamp generator 214 of FIG. 2).

Figure 6:
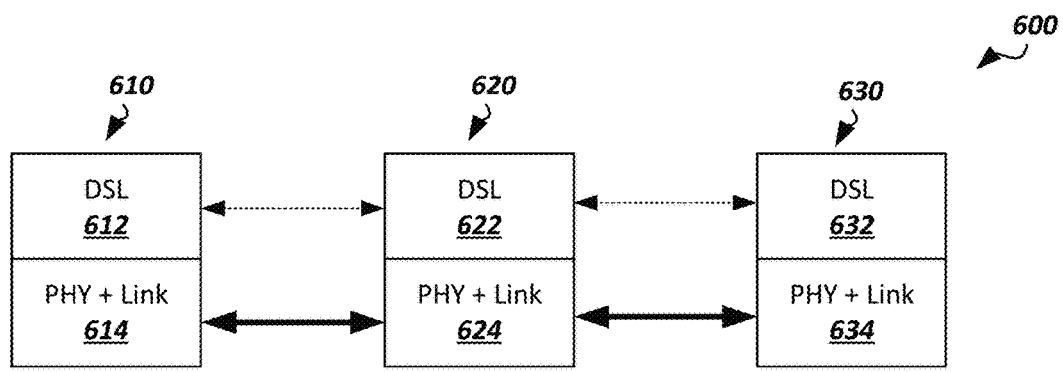
FIG. 6 is a simplified block diagram of example distributed synchronization layers (DSLs) communicating with one another.

In some embodiments, the DSL 510 can be included as part of the Link layer of some communication stacks, or can be placed on top of them. This DSL 510 may have the following services defined: Timestamp reading and Trigger generation via interruption. Furthermore, in some embodiments, the DSL 510 may implement at least a broadcast service for data transport provided by the link layer. This may ensure that the multiple agents in a whole multi-agent system have synchronized timestamps without the need of the network layer 512. This is depicted in FIG. 6, which shows a simplified block diagram 600 of example DSLs 612, 622, 632 of agents 610, 620, 630, respectively, communicating with one another via the PHY and Link layers 614, 624, 626. In the example shown, agent 610 doesn't have direct communication to agent 630, since packets from agent 610 and agent 630 don't necessarily hop through agent 620. However, despite this, agents 610 and 630 may remain synchronized using aspects of the present disclosure.

Figure 7:
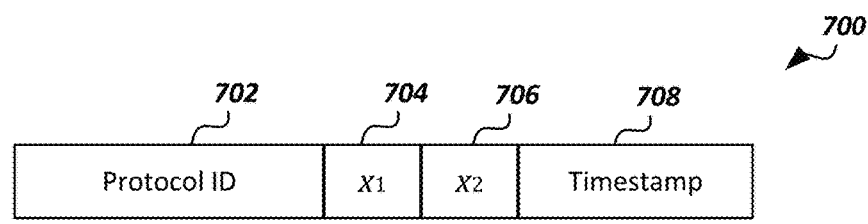
FIG. 7 is a simplified diagram of an example packet structure for communication between DSLs.

FIG. 7 is a simplified diagram of an example packet structure 700 for communication between DSLs in a multi-agent system. The example structure 700 includes a field 702 indicating a protocol used by the DSL to communicate the state values between agents, fields 704, 706 indicating the two state values for the distributed oscillator of the DSL, and a field 708 indicating a timestamp generated based on the state values in fields 704, 706. In some embodiments, the fields shown in FIG. 7 represent a minimum amount of data to needed to be transmitted between agents in a multi-agent system to synchronize with one another. In some cases, the protocol ID of field 702 may be used by a receiver agent to distinguish this protocol from other types of packets transmitted between agents.

Figure 8:
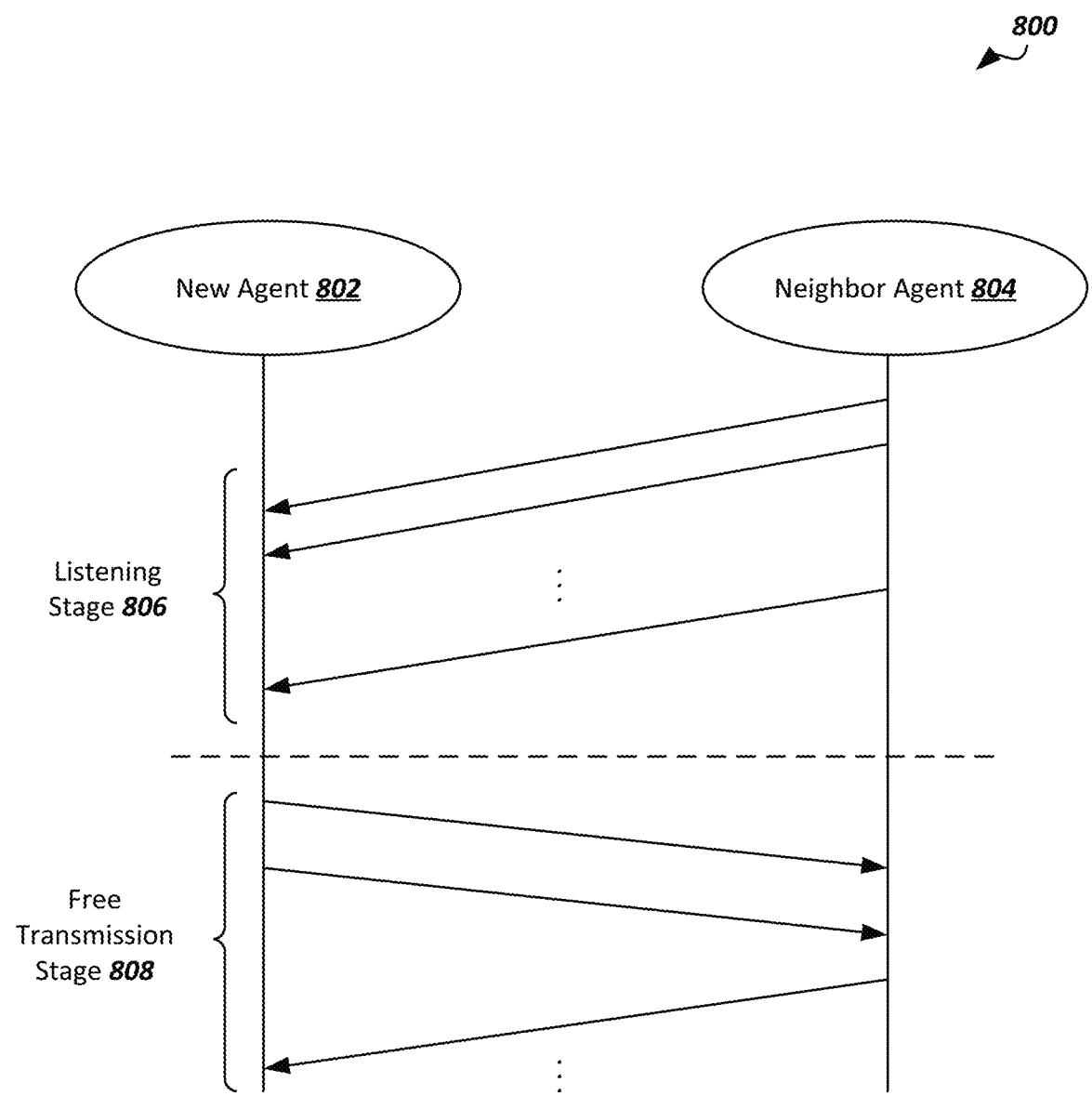
FIG. 8 is a simplified diagram of an example insertion protocol for an agent in a multi-agent system.

FIG. 8 is a simplified diagram of an example insertion protocol 800 for an agent in a multi-agent system. The example protocol 800 may be used by a new agent 802 that has not yet synchronized with the other agents (e.g., neighbor agent 804) of the multi-agent system. For robust behavior, when a new agent 802 wants to synchronize with the other agents, it must first listen for packets from neighbor agent(s) 804 for a certain amount of time until it is synchronized. This time may be referred to as a "listening stage" 806. During the listening stage 806, the new agent 802 does not transmit any packets containing state values for its own oscillator (e.g., packet 700 of FIG. 7). If the new agent 802 receives packets from neighbor agent(s) 804 with state values for their respective oscillators, then the new agent 802 uses the state values to update its own state values (e.g., as described above). The listening stage 806 may be considered complete when the new agent 802 is sufficiently synchronized with the neighbor agent(s) 804 (e.g., the error values computed by the new agent 802 indicating a difference between its state values and the state values for the neighbor agent(s) 804 are below a particular threshold).

After the listening stage 806 is complete, the new agent 802 can begin transmitting, during the free transmission stage 808, its state values to the neighbor agent(s) 804 to help the other agents maintain synchronization. The new agent 802 may also continue to receive packets from the neighbor agent(s) 804, and may continue to update its error values and state values based on the received state values. In some cases, the new agent 802 can remain silent (still listening to packets) after completion of the listening stage 806.

The free transmission stage 808 may begin, in some instances, only when an alive_flag is up (e.g., true for a Boolean alive_flag). In some embodiments, for example, a new agent 802 can raise the alive_flag and begin transmission of packets if it doesn't receive any packets in a certain transmission window (e.g., the listening stage window). When listening in the free transmission stage 808, a agent may store an accumulated error between the local oscillator state values and the received oscillator state values. In some cases, the agent can decide to ignore received data in the free transmission stage 808, such as, for example, where the received oscillator state values are too far away from the local state values or, from a timestamp point of view, if the difference between a local timestamp and an external timestamp (from another agent) is greater than a threshold (i.e., |local timestamp−external stamp|>threshold). In some cases, when the local oscillator need to be executed, the error values may be reset. In this way, when there are no packets being received, the algorithm runs an open loop oscillator. These concepts can be seen in the example flow diagrams of FIGS. 9A-9D.

Figure 9A:
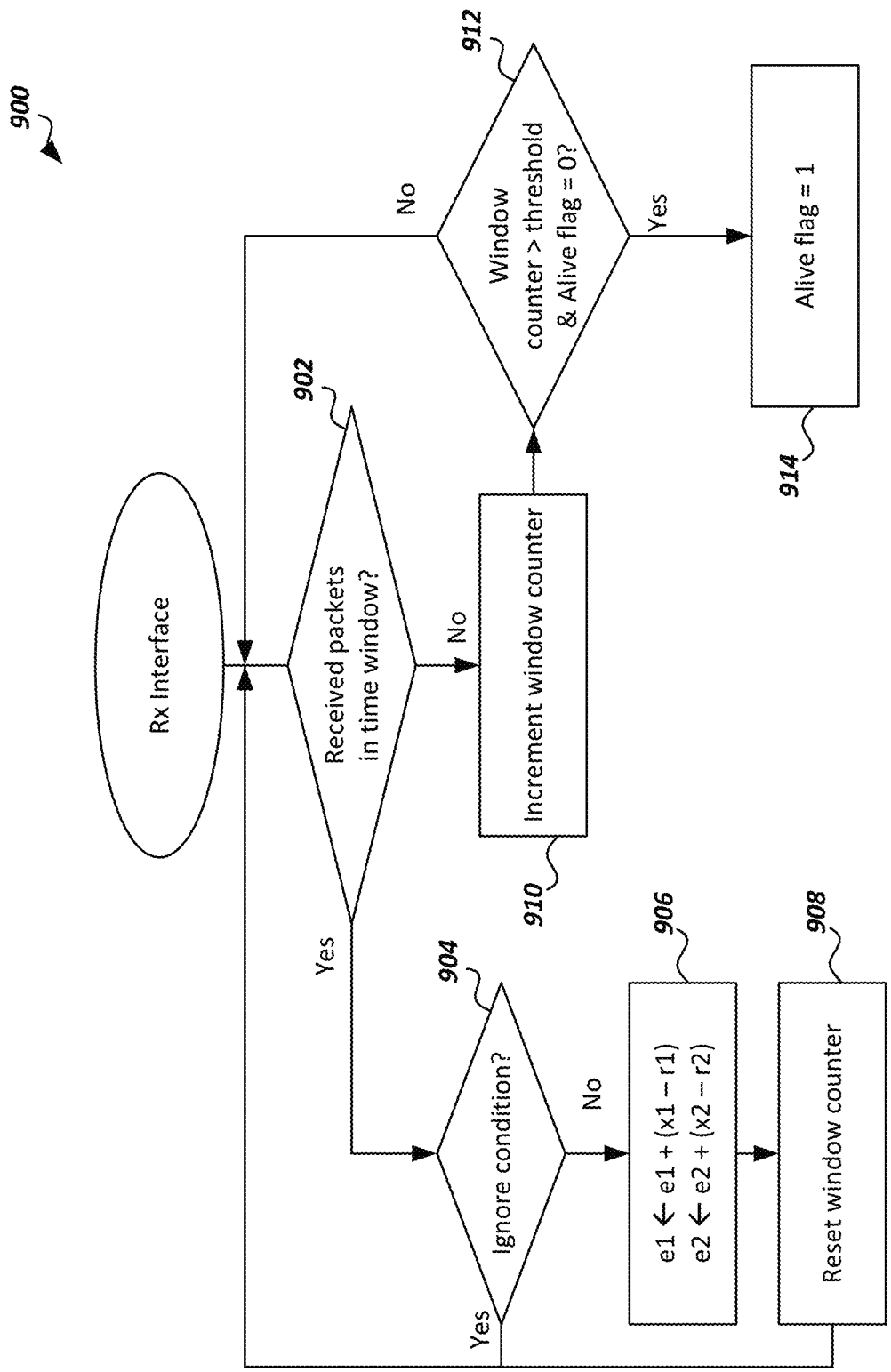
FIGS. 9A-9D are simplified flow diagrams of example processes implemented by different aspects of a distributed oscillator.

In the process 900 of FIG. 9A, a receive interface (e.g., receive interface 302 of FIG. 3) determines at 902 whether it has received any packets from other agents within a particular time window. If it has, then it determines at 904 whether there is a true ignore condition for the received packets. For example, it determines whether received oscillator state values $(r_1, r_2)$ are too far away from local state values $(x_1, x_2)$, or whether the difference between a local timestamp and an external timestamp (from another agent) is greater than a threshold. If there is no true ignore condition present, then the receive interface updates the error values at 906. For example, the error values may be updated by accumulating the error between the received state values, where a first error value is updated according to $e_1 \leftarrow e_1 + (x_1 - r_1)$ and a second error value is updated according to $e_1 \leftarrow e_1 + (x_1 - r_1)$, as shown. If there is a true ignore condition present, then the packets are ignored, and the process returns to 902.

If, on the other hand, it is determined at 902 that no packets have been received within the time window, then a window counter is incremented at 910. It is then determined at 912 whether the window counter is greater than a threshold, and if an alive flag is low/false. If both are true (e.g., the agent determines that it hasn't received packets for long enough), then it raises the alive flag at 914. If either are false, then the process returns to 902.

Figure 9C:
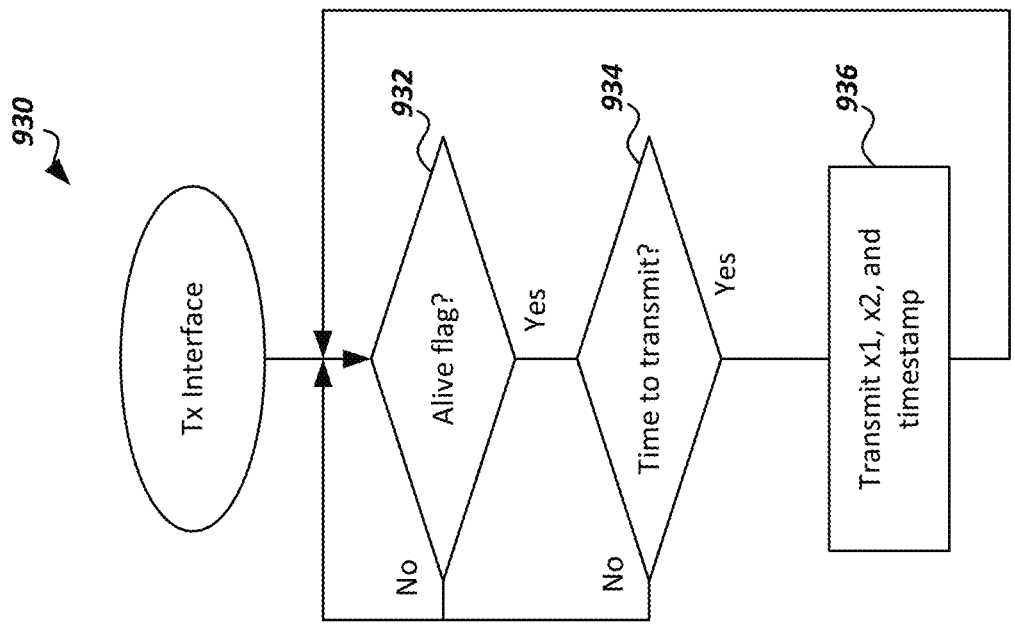
Figure 9B:
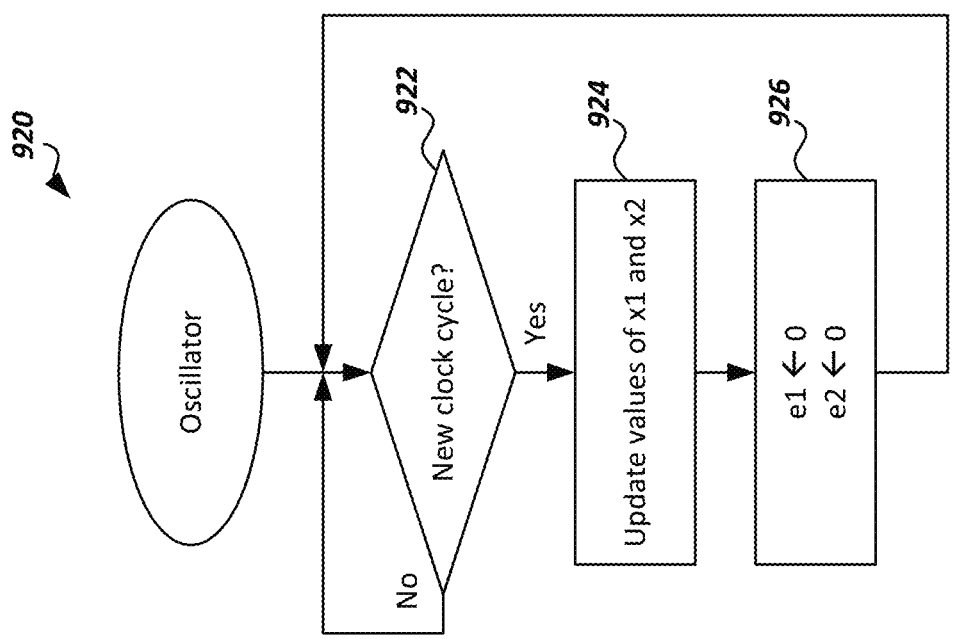

In the process 920 of FIG. 9B, oscillator circuits of an oscillator (e.g., the oscillator circuits 304 of FIG. 3) determine at 922 whether a new clock cycle has begun. If not, the process begins again as the oscillator circuits continue to wait until a new clock cycle. Upon a new clock cycle, the local oscillator state values $(x_1, x_2)$ are updated at 924 using the error values $(e_1, e_2)$ determined by the receive interface, and at 926, the error values are reset.

In the process 930 of FIG. 9C, a transmit interface (e.g., transmit interface 308 of FIG. 3) determines at 932 whether an alive flag has been raised. If not, the process begins again as the transmit interface waits for the alive flag to be raised. Once the alive flag has been raised by the receive interface, the transmit interface determines whether it is time to transmit. For example, the transmit interface may determine whether the agent has completed its listening stage (e.g., listening stage 806 of FIG. 8) before transmitting any local oscillator state values. If it is time to transmit (e.g., the listening stage has completed and the agent is in a free transmission stage), then the transmit interface transmits the local oscillator state values $(x_1, x_2)$ at 936. In some instances, the transmit interface may also transmit a timestamp generated based on the local oscillator state values $(x_1, x_2)$ at 936.

Figure 9D:
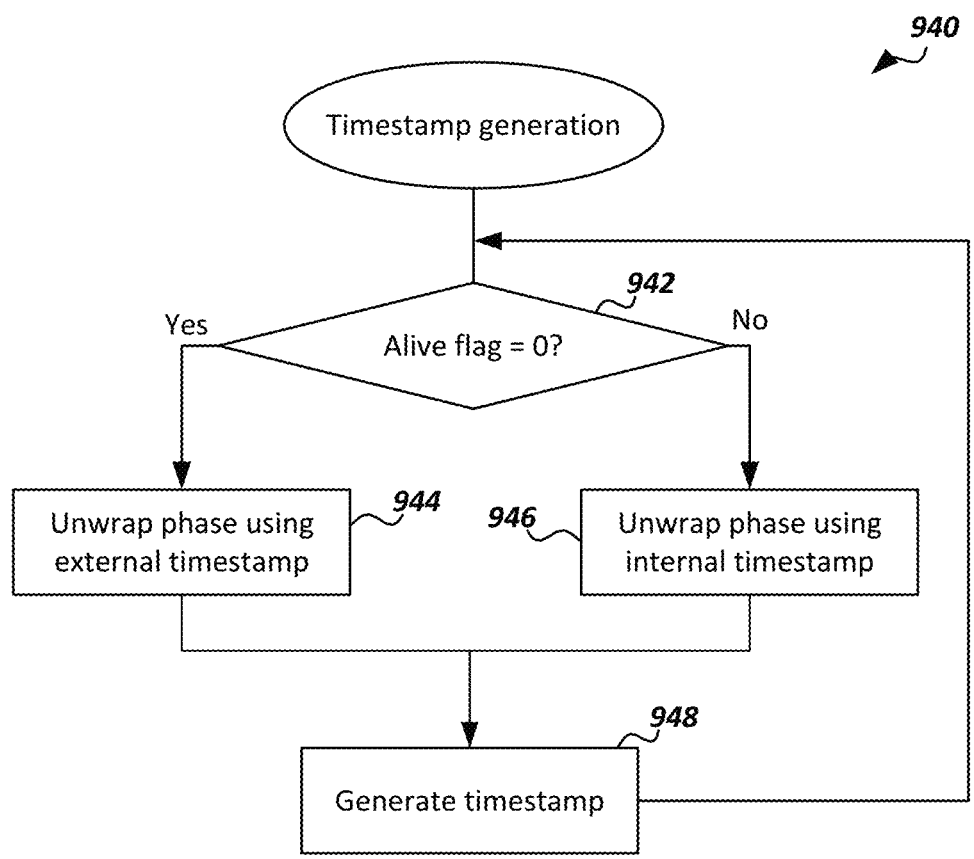

In the process 940 of FIG. 9D, a timestamp generator (e.g., timestamp generator 214 of FIG. 2) determines at 942 whether an alive flag has been raised. If the alive flag has not been raised yet, then the timestamp generator uses an external timestamp previously received from another agent to unwrap a phase value for use in generation of a new timestamp at 944. If the alive flag has been raised, then the timestamp generator uses a previous internal timestamp to unwrap a phase value for use in generation of a new timestamp at 944. At 948, a new timestamp is generated based on the unwrapped phase value.

Figure 10:
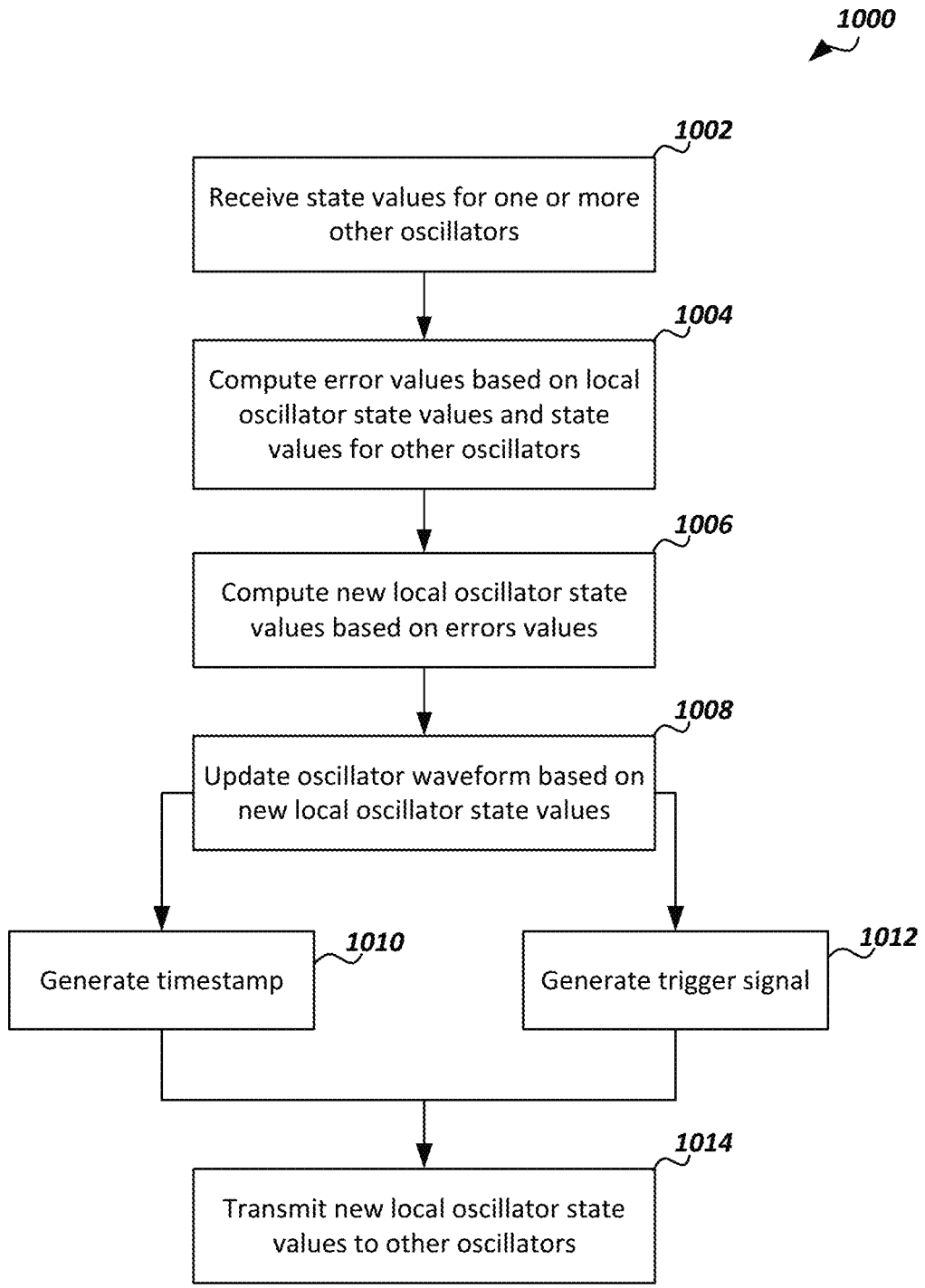
FIG. 10 is a simplified flow diagram illustrating an example technique for generating and updating an oscillator waveform used to synchronize agents of a multi-agent system.

FIG. 10 is a flowchart 1000 illustrating an example technique for generating and updating an oscillator waveform used to synchronize agents of a multi-agent system. The process shown in FIG. 10 may be performed by a distributed oscillator (e.g., distributed oscillator 210 of FIG. 2) implemented by an agent of the multi-agent system. The example process may include additional or different operations, and the operations may be performed in the order shown or in another order. In some cases, one or more of the operations shown in FIG. 10 are implemented as processes that include multiple operations, sub-processes, or other types of routines. In some cases, operations can be combined, performed in another order, performed in parallel, iterated, or otherwise repeated or performed another manner.

At 1002, a distributed oscillator receives state values for one or more other oscillators in a multi-agent system. In some cases, the state values may be received at a receive interface of the distributed oscillator (e.g., 302 of FIG. 3). In other cases, the state values may be received by another portion of the agent (e.g., a communication interface) and may be passed onto the receive interface (e.g., the receive interface may access the state values from memory). The state values may include a first state value and a second state value for each of the other oscillators. The first and second state values of the other oscillators may correspond to local first and second state values for the distributed oscillator. For instance, referring to the examples above, the local state values for an oscillator of agent X may be ($x_1,x_2$), and the agent X may receive state values ($y_1,y_2$) and ($z_1,z_2$) from oscillators of agents Y and Z, respectively.

At 1004, error values are computed based on the local oscillator state values and the state values received at 1002. The error values may be computed by a receive interface (e.g., 302 of FIG. 3) of the distributed oscillator. Each error value may correspond to a particular local oscillator state value. For instance, referring to the examples above, a first error value $u_1$ may correspond to local oscillator state value $x_1$ and first error value $u_2$ may correspond to local oscillator state value $x_2$. Each error value be based on differences between its corresponding local oscillator state value and the corresponding state values for the other oscillators. For instance, first error value $u_1$ may be based on differences between the local oscillator state value $x_1$ and the oscillator state values $y_1$, $z_1$ (e.g., $u_1 = k_1 e_1 = k_1 [(x_1 - y_1) + (x_1 - z_1)]$). In some instances, the error values may be based on previous error values (e.g., the accumulation of error values shown in 906 of FIG. 9A and described above).

At 1006, new local oscillator state values are computed based on the error values computed at 1004. Each local oscillator state value may be computed by a respective oscillator circuit. For instance, the new value for the local oscillator state value $x_1$ may be computed by a first oscillator circuit (e.g., 304A of FIG. 3) and the new value for the local oscillator state value $x_2$ may be computed by a second oscillator circuit (e.g., 304B of FIG. 3). In some instances, the new state values may be computed based on the equation $x_i[n+1] = x_i[n] + \Delta t (f(x_1,x_2) + u_i[n])$, where $x_i[n+1]$ represents a new local oscillator state value, $x_i[n]$ represents a current local oscillator state value, $u_i[n]$ represents the error value corresponding to the local oscillator state value, $\Delta t$ represents a discrete time step between computation of the new and current state values, and $f(x_1,x_2)$ represents an oscillator function. The oscillator function may be one of a Van der Pol-based oscillator function and an Andronov-based oscillator function. Oscillator functions may be implemented by circuitry within an oscillator circuit, and a particular oscillator function used to compute the local oscillator state values may be selected from a set of oscillator functions in some cases (e.g., using a multiplexer circuit as described above with respect to FIG. 4). The new local oscillator state values may be stored in registers (e.g., the registers 306 of FIG. 3). In some instances, the error values $u_1$, $u_2$ may be reset after computation of the new local oscillator state values.

At 1008, an oscillator waveform is updated based on the new local oscillator state values computed at 1006. At 1010, a timestamp is generated based on the oscillator waveform. For example, in some instances, a timestamp may be generated by unwrapping a phase value of the oscillator waveform (e.g., as described above). At 1012, a trigger signal is generated based on the oscillator waveform. For example, in some instances, a trigger signal may be generated based on a zero-cross detection of the oscillator waveform.

At 1014, the new local oscillator state values computed at 1006 are transmitted to the other distributed oscillators in the multi-agent system. The state values may be transmitted by a transmit interface (e.g., 308 of FIG. 3) of the distributed oscillator. In some cases, the state values may only be transmitted by the transmit interface if the oscillator is in a free transmission state (e.g., an alive flag value is set as described above). For example, a flag value may be set by a receive interface in response to it receiving a number of packets greater than a threshold number of packets, and the transmit interface may transmit the new set of state values based on the flag value being set. If the flag is not set, then the transmit interface may not transmit the state values.

Figure 11:
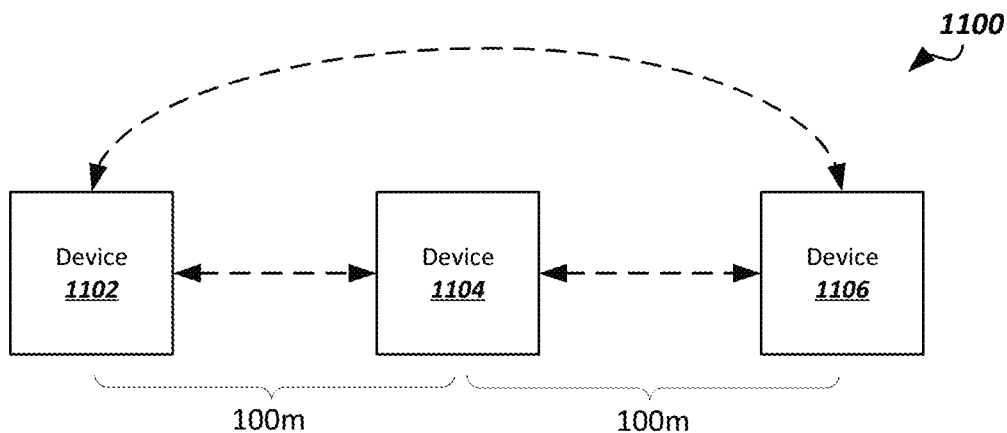
FIG. 11 is a simplified diagram of an example multi-agent system implementing aspects of the present disclosure.

FIG. 11 is a simplified diagram of an example multi-agent system 1100 implementing aspects of the present disclosure. In the example shown, the system 1100 includes devices 1102, 1104, 1106 wirelessly transmitting packets to one another that include the device oscillator state values and/or timestamps. The devices are 100 m apart from one another. The example process 1000 of FIG. 10 may be run periodically to the example system 1100, taking into account the trip delay due to the distance between the device. The devices of the system 1100 may experience drift between their clocks. A standard dynamical model for the time drift may accordingly be taken into account, where each device i generates a time reference $\tau_i$ from which it calculates the period to run the process 1000 of FIG. 10, with model:

$$\frac{d\tau_i}{dt} = 1 + \epsilon_i$$

where $\epsilon_i$ is the clock drift. If $\epsilon_i$ is 0 for all devices, then all devices share the same time reference increase rate, therefore no sophisticated synchronization algorithm is required. However, this might not be realistic. Therefore, in this example, $\epsilon_i$ is a random number between 0 and $1 \times 10^{-2}$ different for each device.

In the example shown, at the beginning only device 1102 is active, broadcasting its state every $T_{fx}$ seconds. Then, after 7 seconds, device 1104 joins. This device, by following the protocol, will hear packets sent by device 1102 during a listening stage as described above. After the error between the two devices 1102, 1104 is sufficiently small (e.g., a synchronization error value below the run-period of 10 ms), the device 1104 may start broadcasting its state in a free transmission stage as described above. Likewise, after 12 seconds, device 1106 joins and performs the same protocol (including the listening stage and transition into the free transmission stage) as device 1104.

Figure 12:
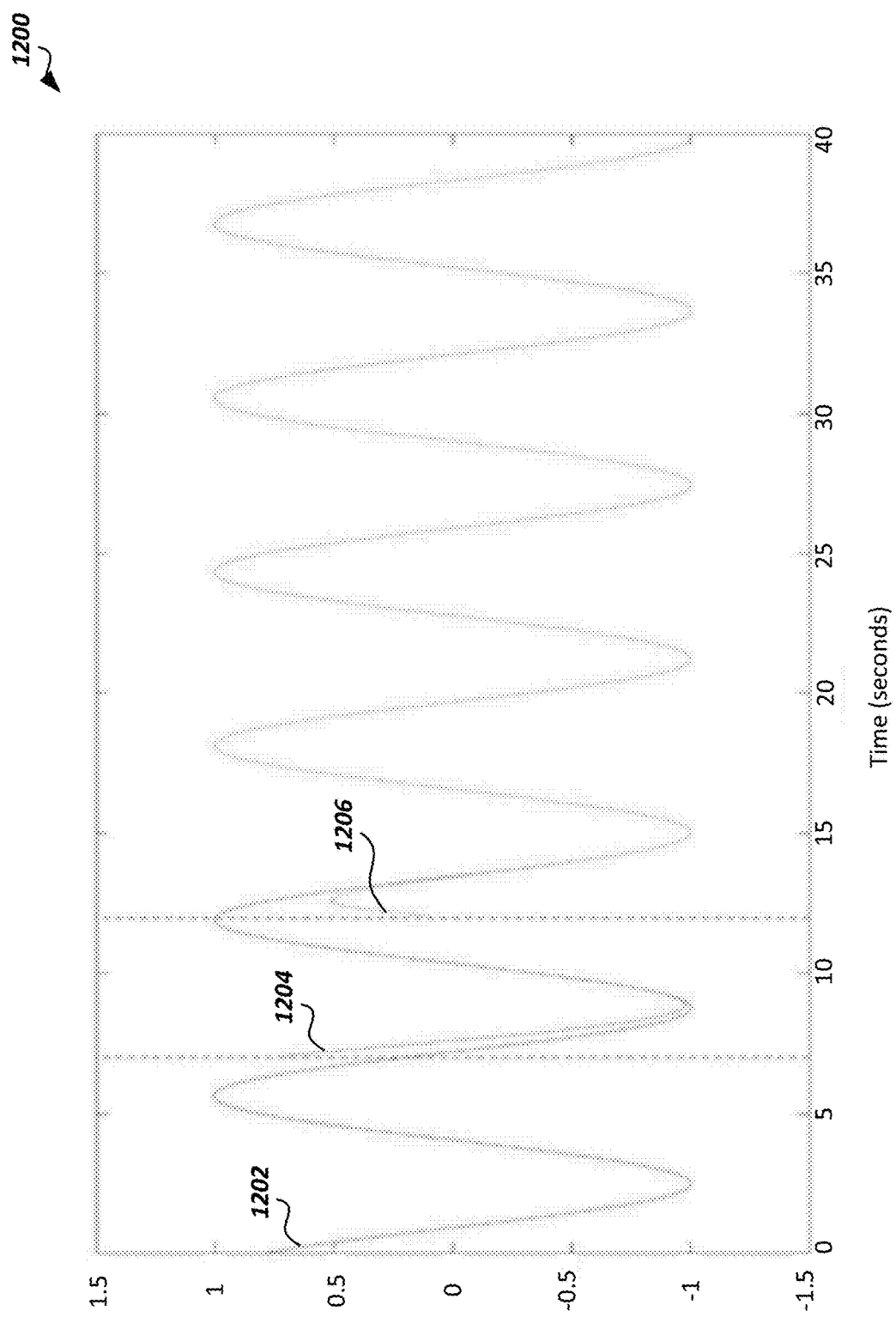
FIG. 12 is a diagram of simulated oscillator waveforms generated by distributed oscillators in the multi-agent system of FIG. 11.

Based on this scenario, the oscillators of devices 1102, 1104, 1106 may generate the simulated waveforms 1202, 1204, 1206, respectively, as shown in FIG. 12. As shown in FIG. 12, each oscillation waveform begins in a de-synchronized state, but after a sufficient amount of time all waveforms converge to the same oscillation.

Figure 13A:
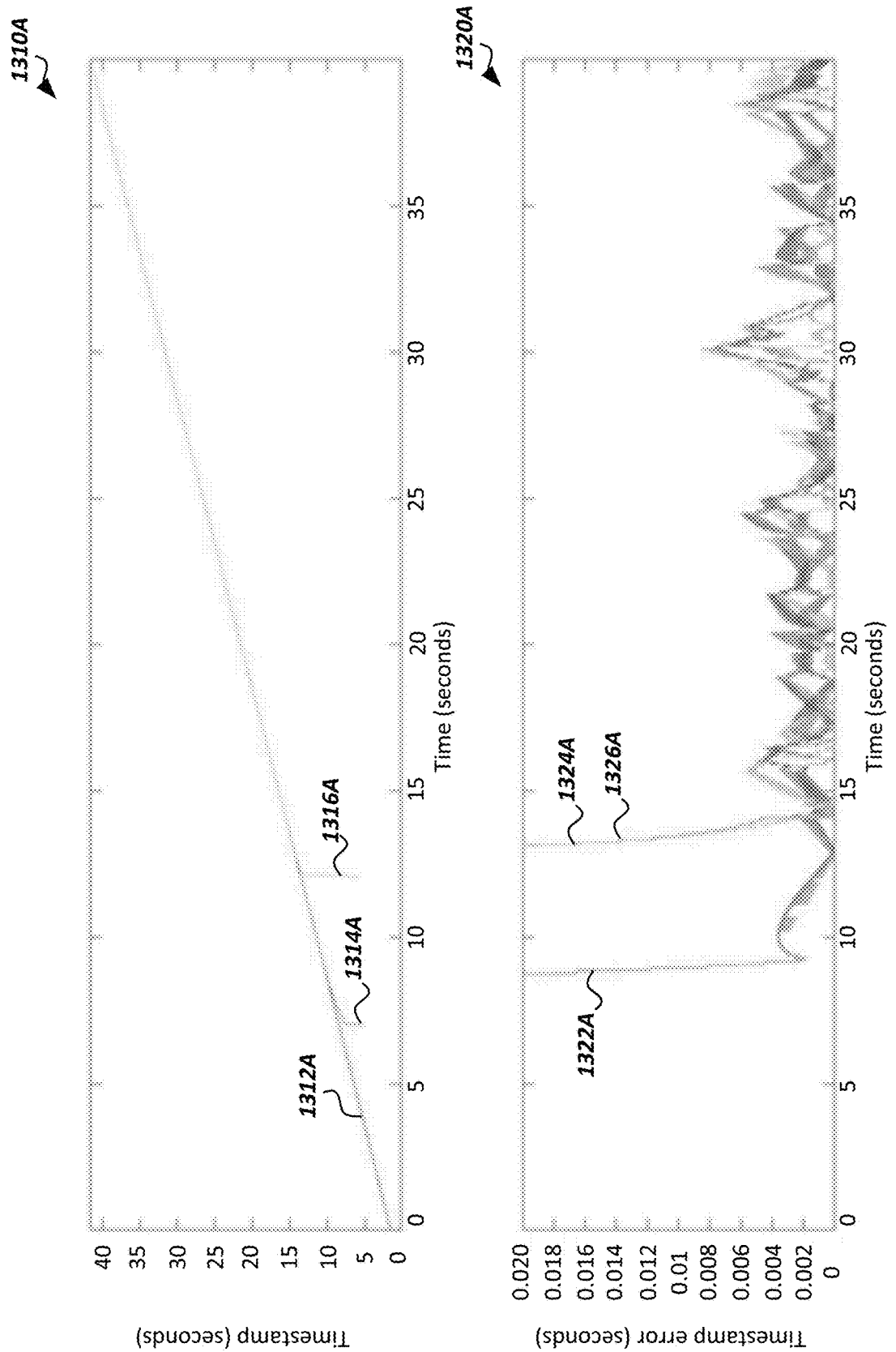
FIGS. 13A-13B are diagrams of simulated timestamp values generated based on the oscillator waveforms of FIG. 12, and errors corresponding to the generated timestamps.
Figure 13B:
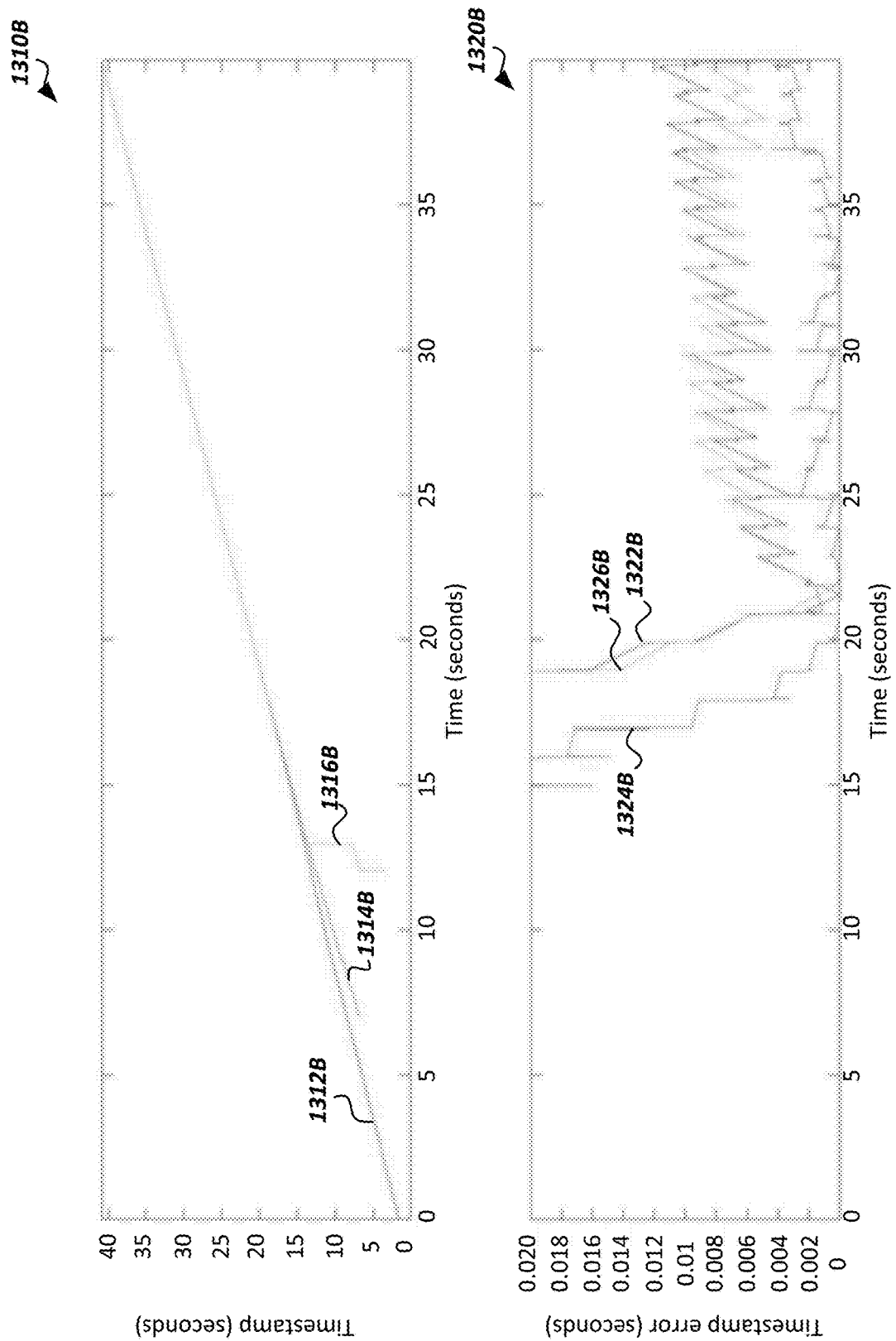

FIGS. 13A-13B are diagrams of simulated timestamp values 1310 generated based on the oscillator waveforms of FIG. 12 and error values 1320 corresponding to the generated timestamps. In particular, FIG. 13A shows results for the generated timestamps 1310A and corresponding errors 1320B using $T_{fx}$=10 ms, and FIG. 13B shows results for the generated timestamps 1310B and corresponding errors 13020B using $T_{fx}$=100 ms. The simulated results in FIGS. 13A-13B were obtained using an execution rate/clock cycle of 100 Hz (i.e., the process 1000 executes every 10 ms).

In FIGS. 13A-13B, the lines 1312 correspond to device 1102, lines 1314 correspond to device 1104, and lines 1316 correspond to device 1106 of FIG. 11. As seen in both of FIGS. 13A and 13B, the timestamps stick together after a transient, providing a "global" time between the devices. Further, in FIGS. 13A-13G the lines 1322 represent the error between the timestamps of devices 1102 and 1104, the lines 1324 represent the error between the timestamps of devices 1102 and 1106, and the lines 1326 represent the error between devices 1104 and 1106. Note that in both FIGS. 13A and 13G, once the timestamps have all converged, the error is in the order of the execution rate (10 ms, i.e., 100 Hz) rather than the transmission rate. (e.g., 100 ms for FIG. 13B).

Simulations using random packet transmissions yield similar results to those shown in FIGS. 13A-13B. In such simulations, the devices transmitted their state with a certain probability (e.g., 9016, 5016 and 116) once they reach the free transmission stage in which they are allowed to transmit. In all these cases, the error is still on the same order of the execution period.

To further validate this, the same system 1100 was simulated using execution rates/clock cycles of 10 kHz (i.e., the process 1000 executes every 100 us) instead of 100 Hz (i.e., the process 1000 executes every 10 ms). In these simulations, the error was still on the same order of the execution rate.

Figure 14:
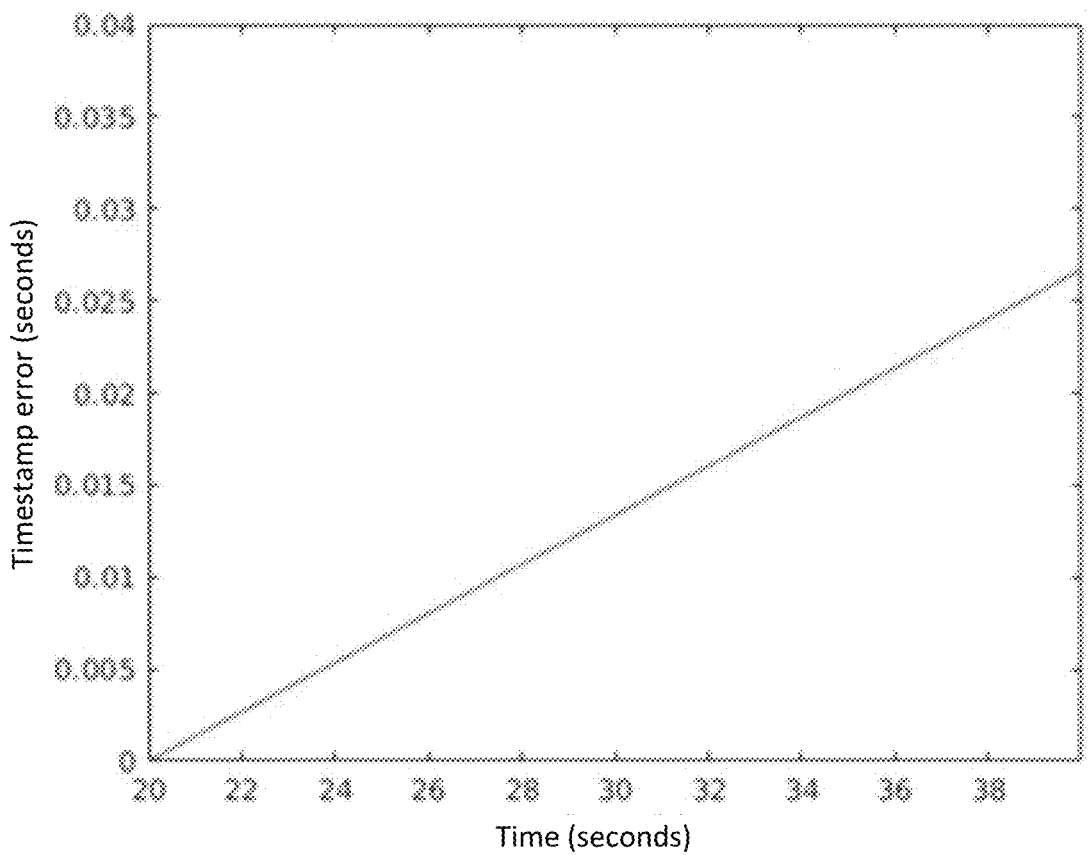
FIG. 14 is a diagram of simulated timestamp errors over time for two devices that were initially synchronized and later lost communication.

These results motivate the use of this algorithm in a dedicated hardware module, to achieve high execution rates obtaining low synchronization errors, even with lower transmission rates. However, it is worth noting that if no communications are sent between the devices, after some time, the devices will lose synchronization. This is shown in FIG. 14, which shows timestamp errors over time after two devices were initially synchronized (running every 10 ms based on a clock cycle of 100 Hz) and later lose communication. As seen in FIG. 14, after approximately 20 seconds, the devices effectively lose synchronization.

The techniques described above may be used in various use cases. As an example, in some cases, the techniques may be used to synchronize planning and decision making in autonomous cars. In real scenarios with autonomous cars, not only a single car should be able to take decisions based on the current reconstructed environment and its own planning strategies, but also cooperate with other surrounding cars to improve the quality of the decisions, which often may have critical hard real time requirements. Hence, synchronization of data shared between cars with high precision is crucial. One of these examples is autonomous platooning, where multiple cars navigate in front of each other in a line with little distance between them at high velocities using coordinated actions. These strategies lead to greater fuel economy, reduced congestion, fewer traffic collisions, among others. However, since these platoons travel at high velocities (>100 km/h) the actions between cars must be coordinated requiring precise synchronization between the agents to prevent usage of delayed or jittered data which may result in incorrect behavior of the fleet, that at these high velocities may be fatal. Accordingly, the techniques described herein may be used to synchronize the vehicles, avoiding these potential issues.

As another example, multiple cameras may be synchronized, such as for environment reconstruction in autonomous car and drone applications. For instance, the distributed creation of environment maps is crucial in autonomous vehicle applications, as the environment maps are used by autonomous vehicles for planning and decision making purposes. As another example, the synchronization of multiple cameras can be used in the creation of immersive experiences and three-dimensional reconstruction of environments/scenarios using images/video from multiple cameras of different perspectives (and thus, with considerable spatial separation between each camera/agent). One of the specific requirements for this type of use case, is the ability to synchronize in time the capture of data from all the sensors. This task may become quite complex when the cameras are not connected to the same physical system (since all compute devices needs to synchronize their respective timestamps in presence of drift, skew or other perturbations.) To overcome these limitations, the hardware modules described herein can be used in a decentralized manner and connected to each camera to enable both timestamp synchronization and also synchronized capture of frames at a configurable rate when a camera trigger is connected to the module and receives synchronized trigger signals generated by the module. It is worth noting that, even if a device stops sending the states of the oscillator, the synchronization may continue for a short period of time (as shown in FIG. 14), which may be useful in the event that some packets are dropped due to communication protocols.

As another example, the synchronization techniques described herein can be used in UWB robotics applications for decentralized synchronization. For instance, the synchronization techniques herein may enable a decentralized ranging device with UWB communication systems. Typically, UWB systems may be synchronized with centralized systems. UWB localization needs fixed beacons with known locations in the area where all UWB devices are synchronized to a single node; if this node fails then an algorithm may select a single working node for synchronization purposes. To ensure accurate clock synchronization in UWB systems, hardware timestamps are used in picosecond precision. For instance, a timestamp of 40 bits may be used where each bit represents $1 \text{ s}/(128 \cdot 499.2 \cdot 10^{\wedge}6)$—which is approximately 15.65 picoseconds. To achieve picoseconds-level accuracy in the synchronization, the techniques described herein can be executed using a picoseconds-level period, which is not far from the frequency used in actual hardware timestamps. Using the proposed hardware in UWB applications would accordingly enable the ability to "globally" timestamp the signals without the need of centralized nodes. In this manner it would be possible to estimate the length of the signal traversed path; thus, estimating the distance between two agents. Possible example uses of this decentralized UWB ranging may include providing robustness to centralized synchronization in UWB localization systems, or in robot swarming applications where it may be necessary to achieve ranging between agents.

Figure 15:
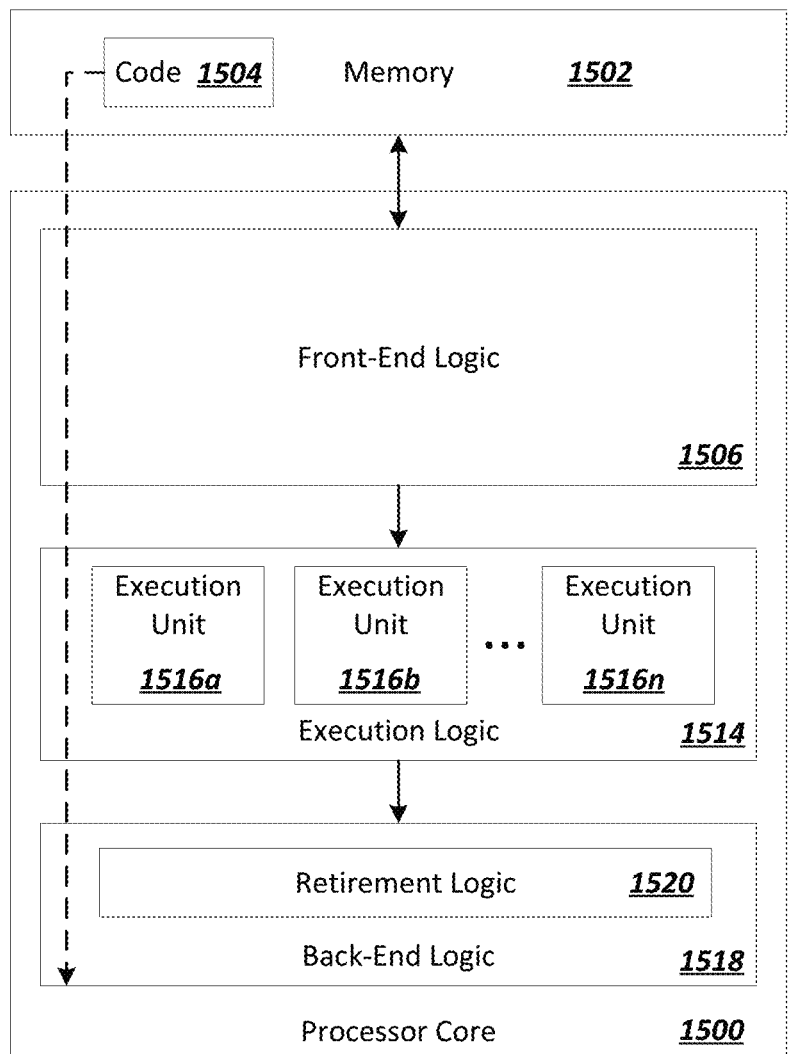
FIG. 15 is a block diagram of an exemplary processor in accordance with some embodiments.
Figure 16:
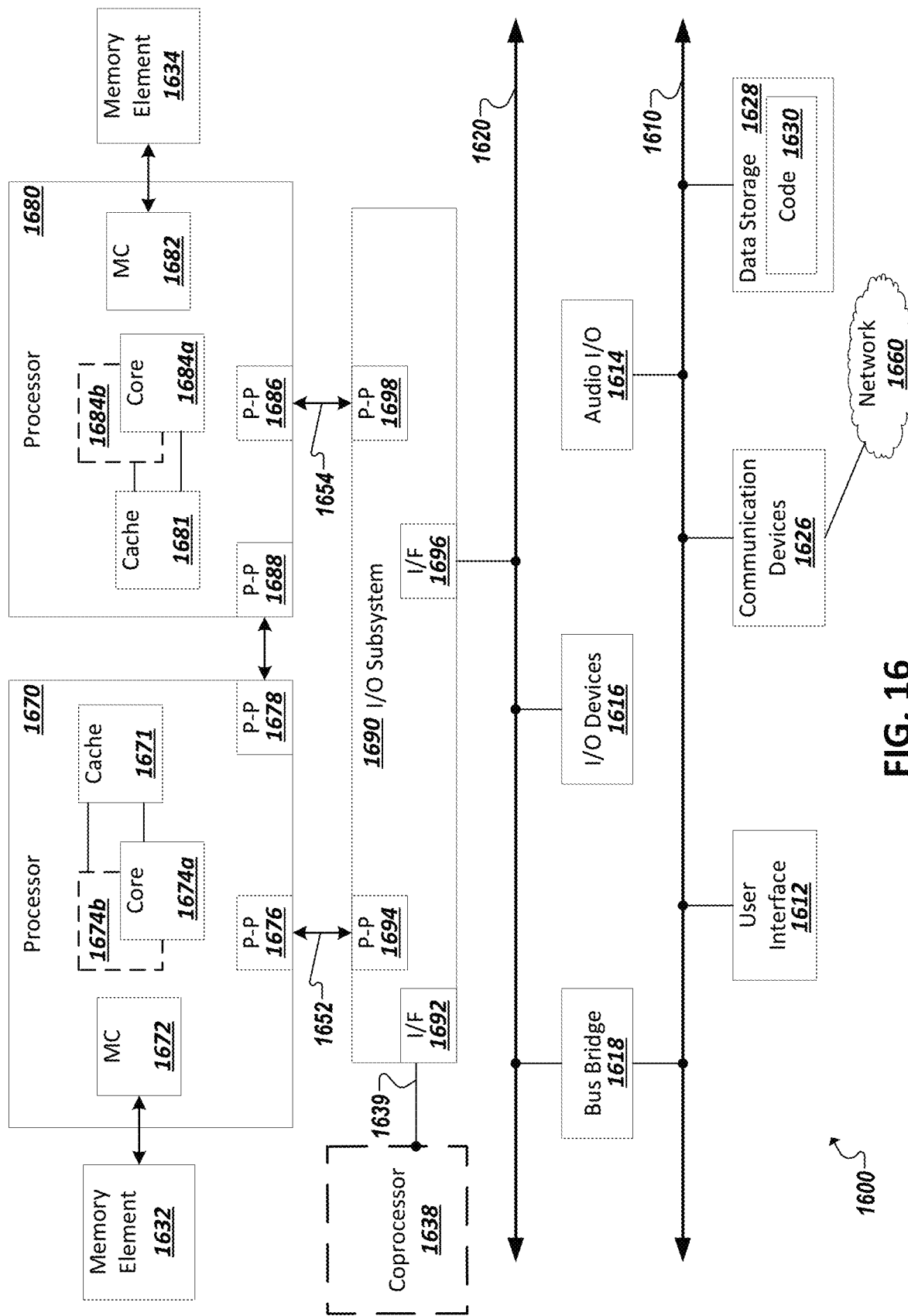
FIG. 16 is a block diagram of an exemplary computing system in accordance with some embodiments.

FIGS. 15-16 are block diagrams of exemplary computer architectures that may be used in accordance with embodiments disclosed herein. Other computer architecture designs known in the art for processors and computing systems may also be used. Generally, suitable computer architectures for embodiments disclosed herein can include, but are not limited to, configurations illustrated in FIGS. 15-16.

FIG. 15 is an example illustration of a processor according to an embodiment. Processor 1500 is an example of a type of hardware device that can be used in connection with the implementations above. Processor 1500 may be any type of processor, such as a microprocessor, an embedded processor, a digital signal processor (DSP), a network processor, a multi-core processor, a single core processor, or other device to execute code. Although only one processor 1500 is illustrated in FIG. 15, a processing element may alternatively include more than one of processor 1500 illustrated in FIG. 15. Processor 1500 may be a single-threaded core or, for at least one embodiment, the processor 1500 may be multi-threaded in that it may include more than one hardware thread context (or "logical processor") per core.

FIG. 15 also illustrates a memory 1502 coupled to processor 1500 in accordance with some embodiments.

Memory 1502 may be any of a wide variety of memories (including various layers of memory hierarchy) as are known or otherwise available to those of skill in the art. Such memory elements can include, but are not limited to, random access memory (RAM), read only memory (ROM), logic blocks of a field programmable gate array (FPGA), erasable programmable read only memory (EPROM), and electrically erasable programmable ROM (EEPROM).

Processor 1500 can execute any type of instructions associated with algorithms, processes, or operations detailed herein. Generally, processor 1500 can transform an element or an article (e.g., data) from one state or thing to another state or thing.

Code 1504, which may be one or more instructions to be executed by processor 1500, may be stored in memory 1502, or may be stored in software, hardware, firmware, or any suitable combination thereof, or in any other internal or external component, device, element, or object where appropriate and based on particular needs. In one example, processor 1500 can follow a program sequence of instructions indicated by code 1504. Each instruction enters a front-end logic 1506 and is processed by one or more decoders 1508. The decoder may generate, as its output, a micro operation such as a fixed width micro operation in a predefined format, or may generate other instructions, microinstructions, or control signals that reflect the original code instruction. Front-end logic 1506 also includes register renaming logic 1510 and scheduling logic 1512, which generally allocate resources and queue the operation corresponding to the instruction for execution.

Processor 1500 can also include execution logic 1514 having a set of execution units 1516a, 1516b, 1516n, etc. Some embodiments may include a number of execution units dedicated to specific functions or sets of functions. Other embodiments may include only one execution unit or one execution unit that can perform a particular function. Execution logic 1514 performs the operations specified by code instructions.

After completion of execution of the operations specified by the code instructions, back-end logic 1518 can retire the instructions of code 1504. In one embodiment, processor 1500 allows out of order execution but requires in order retirement of instructions. Retirement logic 1520 may take a variety of known forms (e.g., re-order buffers or the like). In this manner, processor 1500 is transformed during execution of code 1504, at least in terms of the output generated by the decoder, hardware registers and tables utilized by register renaming logic 1510, and any registers (not shown) modified by execution logic 1514.

Although not shown in FIG. 15, a processing element may include other elements on a chip with processor 1500. For example, a processing element may include memory control logic along with processor 1500. The processing element may include I/O control logic and/or may include I/O control logic integrated with memory control logic. The processing element may also include one or more caches. In some embodiments, non-volatile memory (such as flash memory or fuses) may also be included on the chip with processor 1500.

FIG. 16 illustrates a computing system 1600 that is arranged in a point-to-point (PtP) configuration according to an embodiment. In particular, FIG. 16 shows a system where processors, memory, and input/output devices are interconnected by a number of point-to-point interfaces. Generally, one or more of the computing systems described herein may be configured in the same or similar manner as computing system 1500.

Processors 1670 and 1680 may also each include integrated memory controller logic (MC) 1672 and 1682 to communicate with memory elements 1632 and 1634. In alternative embodiments, memory controller logic 1672 and 1682 may be discrete logic separate from processors 1670 and 1680. Memory elements 1632 and/or 1634 may store various data to be used by processors 1670 and 1680 in achieving operations and functionality outlined herein.

Processors 1670 and 1680 may be any type of processor, such as those discussed in connection with other figures. Processors 1670 and 1680 may exchange data via a point-to-point (PtP) interface 1650 using point-to-point interface circuits 1678 and 1688, respectively. Processors 1670 and 1680 may each exchange data with a chipset 1690 via individual point-to-point interfaces 1652 and 1654 using point-to-point interface circuits 1676, 1686, 1694, and 1698. Chipset 1690 may also exchange data with a co-processor 1638, such as a high-performance graphics circuit, machine learning accelerator, or other co-processor 1638, via an interface 1639, which could be a PtP interface circuit. In alternative embodiments, any or all of the PtP links illustrated in FIG. 16 could be implemented as a multi-drop bus rather than a PtP link.

Chipset 1690 may be in communication with a bus 1620 via an interface circuit 1696. Bus 1620 may have one or more devices that communicate over it, such as a bus bridge 1618 and I/O devices 1616. Via a bus 1610, bus bridge 1618 may be in communication with other devices such as a user interface 1612 (such as a keyboard, mouse, touchscreen, or other input devices), communication devices 1626 (such as modems, network interface devices, or other types of communication devices that may communicate through a computer network 1660), audio I/O devices 1614, and/or a data storage device 1628. Data storage device 1628 may store code 1630, which may be executed by processors 1670 and/or 1680. In alternative embodiments, any portions of the bus architectures could be implemented with one or more PtP links.

The computer system depicted in FIG. 16 is a schematic illustration of an embodiment of a computing system that may be utilized to implement various embodiments discussed herein. It will be appreciated that various components of the system depicted in FIG. 16 may be combined in a system-on-a-chip (SoC) architecture or in any other suitable configuration capable of achieving the functionality and features of examples and implementations provided herein.

While some of the systems and solutions described and illustrated herein have been described as containing or being associated with a plurality of elements, not all elements explicitly illustrated or described may be utilized in each alternative implementation of the present disclosure. Additionally, one or more of the elements described herein may be located external to a system, while in other instances, certain elements may be included within or as a portion of one or more of the other described elements, as well as other elements not described in the illustrated implementation. Further, certain elements may be combined with other components, as well as used for alternative or additional purposes in addition to those purposes described herein.

Further, it should be appreciated that the examples presented above are non-limiting examples provided merely for purposes of illustrating certain principles and features and not necessarily limiting or constraining the potential embodiments of the concepts described herein. For instance, a variety of different embodiments can be realized utilizing various combinations of the features and components described herein, including combinations realized through the various implementations of components described herein. Other implementations, features, and details should be appreciated from the contents of this Specification.

Although this disclosure has been described in terms of certain implementations and generally associated methods, alterations and permutations of these implementations and methods will be apparent to those skilled in the art. For example, the actions described herein can be performed in a different order than as described and still achieve the desirable results. As one example, the processes depicted in the accompanying figures do not necessarily require the particular order shown, or sequential order, to achieve the desired results. In certain implementations, multitasking and parallel processing may be advantageous. Additionally, other user interface layouts and functionality can be supported. Other variations are within the scope of the following claims.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

In general, "servers," "clients," "computing devices," "network elements," "hosts," "blocks," "platforms", "sensor devices," "edge device," "autonomous driving systems", "autonomous vehicles", "fog-based system", "cloud-based system", and "systems" generally, etc. discussed herein can include electronic computing devices operable to receive, transmit, process, store, or manage data and information associated with an autonomous driving environment. As used in this document, the term "computer," "processor," "processor device," or "processing device" is intended to encompass any suitable processing apparatus, including central processing units (CPUs), graphical processing units (GPUs), application specific integrated circuits (ASICs), field programmable gate arrays (FPGAs), digital signal processors (DSPs), tensor processors and other matrix arithmetic processors, among other examples. For example, elements shown as single devices within the environment may be implemented using a plurality of computing devices and processors, such as server pools including multiple server computers. Further, any, all, or some of the computing devices may be adapted to execute any operating system, including Linux, UNIX, Microsoft Windows, Apple OS, Apple iOS, Google Android, Windows Server, etc., as well as virtual machines adapted to virtualize execution of a particular operating system, including customized and proprietary operating systems.

Any of the flows, methods, processes (or portions thereof) or functionality of any of the various components described above or illustrated in the figures may be performed by any suitable computing logic, such as one or more modules, engines, blocks, units, models, systems, or other suitable computing logic. Reference herein to a "module", "engine", "block", "unit", "model", "system" or "logic" may refer to hardware, firmware, software and/or combinations of each to perform one or more functions. As an example, a module, engine, block, unit, model, system, or logic may include one or more hardware components, such as a micro-controller or processor, associated with a non-transitory medium to store code adapted to be executed by the micro-controller or processor. Therefore, reference to a module, engine, block, unit, model, system, or logic, in one embodiment, may refers to hardware, which is specifically configured to recognize and/or execute the code to be held on a non-transitory medium. Furthermore, in another embodiment, use of module, engine, block, unit, model, system, or logic refers to the non-transitory medium including the code, which is specifically adapted to be executed by the microcontroller or processor to perform predetermined operations. And as can be inferred, in yet another embodiment, a module, engine, block, unit, model, system, or logic may refer to the combination of the hardware and the non-transitory medium. In various embodiments, a module, engine, block, unit, model, system, or logic may include a microprocessor or other processing element operable to execute software instructions, discrete logic such as an application specific integrated circuit (ASIC), a programmed logic device such as a field programmable gate array (FPGA), a memory device containing instructions, combinations of logic devices (e.g., as would be found on a printed circuit board), or other suitable hardware and/or software. A module, engine, block, unit, model, system, or logic may include one or more gates or other circuit components, which may be implemented by, e.g., transistors. In some embodiments, a module, engine, block, unit, model, system, or logic may be fully embodied as software. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices. Furthermore, logic boundaries that are illustrated as separate commonly vary and potentially overlap. For example, a first and second module (or multiple engines, blocks, units, models, systems, or logics) may share hardware, software, firmware, or a combination thereof, while potentially retaining some independent hardware, software, or firmware.

The flows, methods, and processes described above and in the accompanying figures are merely representative of functions that may be performed in particular embodiments. In other embodiments, additional functions may be performed in the flows, methods, and processes. Various embodiments of the present disclosure contemplate any suitable signaling mechanisms for accomplishing the functions described herein. Some of the functions illustrated herein may be repeated, combined, modified, or deleted within the flows, methods, and processes where appropriate. Additionally, functions may be performed in any suitable order within the flows, methods, and processes without departing from the scope of particular embodiments.

The following examples pertain to embodiments in accordance with this Specification. It will be understood that, in some instances, one or more aspects certain examples described below may be combined with other examples.

Example 1 is a distributed oscillator apparatus comprising: receiver circuitry to: obtain first and second state values for one or more other distributed oscillators; compute a first error value based on a first state value for the distributed oscillator apparatus and the first state values for the one or more other distributed oscillators; and compute a second error value based on a second state value for the distributed oscillator apparatus and the second state values for the one or more other distributed oscillators; a first oscillator circuit to compute a new first state value for the distributed oscillator apparatus based on the first error value, the first state value for the distributed oscillator apparatus, and the second state value for the distributed oscillator apparatus; a second oscillator circuit to compute a new second state value for the distributed oscillator based on the second error value, the first state value for the distributed oscillator apparatus, and the second state value for the distributed oscillator apparatus; and transmitter circuitry coupled to the first and second oscillator circuits to transmit the new first state value and the new second state value to the one or more other distributed oscillators.

Example 2 includes the subject matter of example 1, where the first error value is computed based on respective differences between the first state value for the distributed oscillator apparatus and each of the one or more first state values for the other distributed oscillators; and the second error value is computed based on respective differences between the second state value for the distributed oscillator apparatus and each of the one or more second state values for the other distributed oscillators.

Example 3 includes the subject matter of example 2, where: the first error value is based on a sum of the respective differences between the first state value for the distributed oscillator apparatus and each of the one or more first state values for the other distributed oscillators; and the second error value is based on a sum of the respective differences between the second state value for the distributed oscillator apparatus and each of the one or more second state values for the other distributed oscillators.

Example 4 includes the subject matter of example 1, where the first and second oscillator circuits are to compute the respective new state values based on the equation $x_i[n+1]=x_i[n]+\Delta t(f(x_1,x_2)+u_i[n])$, where $x_i[n+1]$ represents the respective new state value, $x_i[n]$ represents the respective state value, $\Delta t$ represents a discrete time step between computation of the state values, $f(x_1,x_2)$ represents an oscillator function, and $u_i[n]=k_i e_i$, where $e_i$ represents the respective error value and $k_i$ is a constant.

Example 5 includes the subject matter of example 1, where the first and second oscillator circuits each comprise a multiplexer to select an oscillator function from a set of oscillator functions, and the respective new state values computed by the first and second oscillator circuits are based on the selected oscillator function.

Example 6 includes the subject matter of example 5, where the set of oscillator functions comprises at least one of a Van der Pol-based oscillator function and an Andronov-based oscillator function.

Example 7 includes the subject matter of example 1, where the apparatus further comprises circuitry to update an oscillation waveform based on the new first state value and the new second state value.

Example 8 includes the subject matter of example 1, where the apparatus further comprises circuitry to generate one or more of a timestamp and a trigger signal based on the new first state value and the new second state value.

Example 9 includes the subject matter of example 8, where the circuitry is to generate a timestamp by unwrapping a phase value based on the new first state value and the new second state value.

Example 10 includes the subject matter of example 8, where the circuitry is to generate a trigger signal based on a zero-cross detection of a waveform based on the new first state value and the new second state value.

Example 11 includes the subject matter of example 1, where: the receiver circuitry is further to set a flag value in response to receiving a number of packets greater than a threshold number of packets, wherein the packets comprise the first and second state values for the one or more other distributed oscillators; and the transmitter circuitry is further to transmit the new first state value and the new second state value based on the flag value being set.

Example 12 includes the subject matter of example 1, where the receiver circuitry is to compute the first error value further based on a previous first error value and compute the second error value further based on a previous second error value.

Example 13 includes the subject matter of example 1, where: the first oscillator circuit is further to reset the first error value after computing the new first state value; the second oscillator circuit is further to reset the second error value after computing the new first state value.

Example 14 includes the subject matter of example 1, where the apparatus further comprises: a first register coupled to the first oscillator circuit to store state values output by the first oscillator circuit; and a second registers coupled to the second oscillator circuits to store state values output by the second oscillator circuit.

Example 15 is a method that includes: receiving, at a first distributed oscillator of a first agent in a multi-agent system, a set of state values for one or more second distributed oscillators of respective second agents in the multi-agent system; computing a set of error values for the first distributed oscillator based on a current set of state values for the first distributed oscillator and the set of state values for the second distributed oscillators, wherein each error value corresponds to a particular state value in the current set of state values and is based on respective differences between the particular state value and state values for the second distributed oscillators corresponding to the particular state value; computing a new set of state values for the first distributed oscillator based on the set of error values and the current set of state values for the first distributed oscillator; and transmitting the new set of state values for the first distributed oscillator to the second distributed oscillators.

Example 16 includes the subject matter of example 15, where computing the set of error values for the first distributed oscillator comprises: computing a first error value based on a first state value of the current set of state values and first state values for the second distributed oscillators; computing a second error value based on a second state value of the current set of state values and second state values for the second distributed oscillators.

Example 17 includes the subject matter of example 15, where the current set of state values for the first distributed oscillator comprises a current first state value and a current second state value, the set of error values comprises a first error value corresponding to the current first state value and a second error value corresponding to the current second state value, and computing the new set of state values comprises: computing a new first state value based on the first error value, the current first state value, and the current second state value; and computing a new second state value based on the second error value, the current first state value, and the current second state value.

Example 18 includes the subject matter of example 15, where the new set of state values for the first distributed oscillator are computed based on the equation $x_i[n+1]=x_i[n]+\Delta t(f(x_1,x_2)+u_i[n])$, where $x_i[n+1]$ represents a new i-th state value for the first distributed oscillator, $x_i[n]$ represents a current i-th state value for the first distributed oscillator, $\Delta t$ represents a discrete time step between computation of the state values, $f(x_1,x_2)$ represents an oscillator function, and $u_i[n]=k_i e_i$, where $e_i$ represents the i-th error value and $k_i$ is a constant.

Example 19 includes the subject matter of example 15, where the method further includes selecting an oscillator function from a set of oscillator functions, wherein the new set of state values are computed based on the selected oscillator function.

Example 20 includes the subject matter of example 19, where the set of oscillator functions comprises at least one of a Van der Pol-based oscillator function and an Andronov-based oscillator function.

Example 21 includes the subject matter of example 15, where the method further includes updating an oscillation waveform based on the new set of state values.

Example 22 includes the subject matter of example 15, where the method further includes generating one or more of a timestamp and a trigger signal based on the new set of state values.

Example 23 includes the subject matter of example 22, where a timestamp is generated by unwrapping a phase value based on the new set of state values.

Example 24 includes the subject matter of example 22, where a trigger signal is generated based on a zero-cross detection of a waveform based on the new set of state values.

Example 25 includes the subject matter of example 15, where: the method further includes setting a flag value in response to receiving a number of packets greater than a threshold number of packets, wherein the packets comprise the set of state values for the second distributed oscillators; and transmitting the new set of state values is based on the flag value being set.

Example 26 includes the subject matter of example 15, where computing the set of error values is further based on previously computed error values.

Example 27 includes the subject matter of example 15, where the method further includes resetting the error values after computing the new set of state values.

Example 28 includes the subject matter of example 15, where the method further includes storing each state value of the new set of state values in a respective register.

Example 29 is an apparatus configured to perform one or more of the methods of examples 15-28.

Example 30 is a system comprising means to perform one or more of the methods of examples 15-28.

Example 31 is an apparatus, comprising: a distributed oscillator to: obtain a set of state values for other distributed oscillators; compute a set of error values for the distributed oscillator based on a current set of state values for the distributed oscillator and the set of state values for the other distributed oscillators, wherein each error value corresponds to a particular state value in the current set of state values and is based on respective differences between the particular state value and state values for the second distributed oscillators corresponding to the particular state value; compute a new set of state values for the distributed oscillator based on the set of error values and a current set of state values for the distributed oscillator; and generate a timestamp based on the new set of state values; and a sensor coupled to the distributed oscillator, the sensor to receive the timestamp from the distributed oscillator and use the timestamp to generate data.

Example 32 includes the subject matter of example 31, where the distributed oscillator is further to generate a trigger signal based on the new set of state values, and the apparatus further comprises an actuator to receive the trigger signal and perform a function in response to the trigger signal.

Example 33 includes the subject matter of example 31, where the distributed oscillator is to compute the set of error values for the first distributed oscillator by: computing a first error value based on a first state value of the current set of state values and first state values for the distributed oscillators of the other agents; computing a second error value based on a second state value of the current set of state values and second state values for the distributed oscillators of the other agents.

Example 34 includes the subject matter of example 33, where the distributed oscillator is to compute the new set of state values by: computing a new first state value for distributed oscillator based on the first error value, the first state value of the current set of state values, and the second state value of the current set of state values; and computing a new second state value for the distributed oscillator based on the second error value, the first state value of the current set of state values, and the second state value of the current set of state values.

Example 35 includes the subject matter of example 31, where the distributed oscillator is to compute the new set of state values based on the equation $x_i[n+1]=x_i[n]+\Delta t(f(x_1,x_2)+u_i[n])$, where $x_i[n+1]$ represents a new state value for the distributed oscillator, $x_i[n]$ represents a current state value for the distributed oscillator, $u_i[n]$ represents an error value, $\Delta t$ represents a discrete time step between computation of the new and current state values, and $f(x_1,x_2)$ represents an oscillator function.

Example 36 is a multi-agent system, comprising: a plurality of agents communicably coupled to at least one other agent in the multi-agent system, wherein each agent comprises a distributed oscillator to: receive a set of state values for the distributed oscillators of the other agents; compute a set of error values for the distributed oscillator based on a current set of state values for the distributed oscillator, wherein each error value corresponds to a particular state value in the current set of state values and is based on respective differences between the particular state value and state values for the second distributed oscillators corresponding to the particular state value; compute a new set of state values for the distributed oscillator based on the set of error values and the current set of state values for the distributed oscillator; and transmit the new set of state values to the distributed oscillators of the other agents Example 37 includes the subject matter of example 36, where the distributed oscillator is to compute the set of error values for the first distributed oscillator by: computing a first error value based on a first state value for the distributed oscillator and first state values for the distributed oscillators of the other agents; computing a second error value based on a second state value for the distributed oscillator and second state values for the distributed oscillators of the other agents.

Example 38 includes the subject matter of example 37, where the distributed oscillator is to compute the new set of state values comprises: computing a new first state value for distributed oscillator based on a first error value, a current first state value for the distributed oscillator, and a current second state value for the distributed oscillator; and computing a new second state value for the distributed oscillator based on a second error value, the current first state value for the distributed oscillator, and the current second state value for the distributed oscillator.

Example 39 includes the subject matter of example 36, where the distributed oscillator is to compute the new set of state values based on the equation $x_i[n+1]=x_i[n]+\Delta t(f(x_1,x_2)+u_i[n])$, where $x_i[n+1]$ represents a new state value for the distributed oscillator, $x_i[n]$ represents a current state value for the distributed oscillator, $u_i[n]$ represents an error value, $\Delta t$ represents a discrete time step between computation of the new and current state values, and $f(x_1,x_2)$ represents an oscillator function.

Example 40 includes the subject matter of example 36, where each agent further comprises circuitry to generate one or more of a timestamp or a trigger signal based on the new set of state values.

Example 41 includes the subject matter of example 40, where each agent further comprises a component to receive the timestamp or trigger signal from the distributed oscillator and perform an action based on the timestamp or trigger signal.

Example 42 is a multi-agent system that includes: a plurality of agents communicably coupled to at least one other agent in the multi-agent system. Each agent includes a local distributed oscillator to: obtain first and second state values for each distributed oscillator of the other agents in the multi-agent system, wherein the first state values correspond to a first local state value of the distributed oscillator, and the second state values correspond to a second local state value of the distributed oscillator; compute a first error value based on the first local state value and the first state values for the distributed oscillators of the other agents in the multi-agent system; compute a second error value based on the second local state value and the second state values for the distributed oscillators of the other agents in the multi-agent system; compute a new first local state value for the distributed oscillator based on the first error value, the first local state value, and the second local state value; compute a new second state value for the distributed oscillator based on the second error value, the first local state value, and the second local state value; and transmit the new first local state value and the new second local state value to the distributed oscillators of the other agents in the multi-agent system.

Example 43 includes the subject matter of Example 42, where the distributed oscillator of each agent is to compute the new local state values based on the equation $x_i[n+1]=x_i[n]+\Delta t(f(x_1,x_2)+u_i[n])$, where $x_i[n+1]$ represents a new i-th local state value, $x_i[n]$ represents a current i-th local state value, $\Delta t$ represents a discrete time step between computation of the current and new local state values, $f(x_1,x_2)$ represents an oscillator function, and $u_i[n]=k_i e_i$, where $e_i$ represents the i-th error value and $k_i$ is a constant.

Example 44 includes the subject matter of Example 42, where each agent further comprises circuitry to generate one or more of a timestamp or a trigger signal based on the new first and second local state values.

Example 45 includes the subject matter of example 44, where each agent further comprises a component to receive the timestamp or trigger signal from the distributed oscillator and perform an action based on the timestamp or trigger signal.

Thus, particular embodiments of the subject matter have been described. Other embodiments are within the scope of the following claims. In some cases, the actions recited in the claims can be performed in a different order and still achieve desirable results. In addition, the processes depicted in the accompanying figures do not necessarily require the particular order shown, or sequential order, to achieve desirable results.

What is claimed is:

1. A distributed oscillator apparatus comprising:
   receiver circuitry to:
   obtain first and second state values for one or more other distributed oscillators;
   compute a first error value based on a first state value for the distributed oscillator apparatus and the first state values for the other distributed oscillators; and
   compute a second error value based on a second state value for the distributed oscillator apparatus and the second state values for the other distributed oscillators;
   a first oscillator circuit to compute a new first state value for the distributed oscillator apparatus based on the first error value, the first state value for the distributed oscillator apparatus, and the second state value for the distributed oscillator apparatus;
   a second oscillator circuit to compute a new second state value for the distributed oscillator based on the second error value, the first state value for the distributed oscillator apparatus, and the second state value for the distributed oscillator apparatus; and
   transmitter circuitry coupled to the first and second oscillator circuits to transmit the new first state value and the new second state value to the other distributed oscillators.

2. The distributed oscillator apparatus of claim 1, wherein:
   the first error value is computed based on respective differences between the first state value for the distributed oscillator apparatus and each of the one or more first state values for the other distributed oscillators; and
   the second error value is computed based on respective differences between the second state value for the distributed oscillator apparatus and each of the one or more second state values for the other distributed oscillators.

3. The distributed oscillator apparatus of claim 2, wherein:
   the first error value is based on a sum of the respective differences between the first state value for the distributed oscillator apparatus and each of the one or more first state values for the other distributed oscillators;
   the second error value is based on a sum of the respective differences between the second state value for the distributed oscillator apparatus and each of the one or more second state values for the other distributed oscillators.

4. The distributed oscillator apparatus of claim 1, wherein the first and second oscillator circuits are to compute the respective new state values based on the equation $x_i[n+1]=x_i[n]+\Delta t(f(x_1,x_2)+u_i[n])$, where $x_i[n+1]$ represents the respective new state value, $x_i[n]$ represents the respective state value, Δt represents a discrete time step between computation of the state values, $f(x_1,x_2)$ represents an oscillator function, and $u_i[n]=k_i e_i$, where $e_i$ represents the respective error value and $k_i$ is a constant.

5. The distributed oscillator apparatus of claim 1, wherein the first and second oscillator circuits each comprise a multiplexer to select an oscillator function from a set of oscillator functions, and the respective new state values computed by the first and second oscillator circuits are based on the selected oscillator function.

6. The distributed oscillator apparatus of claim 5, wherein the set of oscillator functions comprises at least one of a Van der Pol-based oscillator function and an Andronov-based oscillator function.

7. The distributed oscillator apparatus of claim 1, further comprising circuitry to update an oscillation waveform based on the new first state value and the new second state value.

8. The distributed oscillator apparatus of claim 1, further comprising circuitry to generate one or more of a timestamp and a trigger signal based on the new first state value and the new second state value.

9. The distributed oscillator apparatus of claim 8, wherein the circuitry is to generate a timestamp by unwrapping a phase value based on the new first state value and the new second state value.

10. The distributed oscillator apparatus of claim 8, wherein the circuitry is to generate a trigger signal based on a zero-cross detection of a waveform based on the new first state value and the new second state value.

11. The distributed oscillator apparatus of claim 1, wherein:
the receiver circuitry is further to set a flag value in response to receiving a number of packets greater than a threshold number of packets, wherein the packets comprise the first and second state values for the other distributed oscillators; and
the transmitter circuitry is further to transmit the new first state value and the new second state value based on the flag value being set.

12. The distributed oscillator apparatus of claim 1, wherein the receiver circuitry is to compute the first error value further based on a previous first error value and compute the second error value further based on a previous second error value.

13. The distributed oscillator apparatus of claim 1, wherein:
the first oscillator circuit is further to reset the first error value after computing the new first state value;
the second oscillator circuit is further to reset the second error value after computing the new first state value.

14. The distributed oscillator apparatus of claim 1, further comprising:
a first register coupled to the first oscillator circuit to store state values output by the first oscillator circuit; and
a second registers coupled to the second oscillator circuits to store state values output by the second oscillator circuit.

15. A method, comprising:
receiving, at a first distributed oscillator of a first agent in a multi-agent system, a set of state values for one or more second distributed oscillators of respective second agents in the multi-agent system;
computing a set of error values for the first distributed oscillator based on a current set of state values for the first distributed oscillator and the set of state values for the second distributed oscillators, wherein each error value corresponds to a particular state value in the current set of state values and is based on respective differences between the particular state value and state values for the second distributed oscillators corresponding to the particular state value;
computing a new set of state values for the first distributed oscillator based on the set of error values and the current set of state values for the first distributed oscillator; and
transmitting the new set of state values for the first distributed oscillator to the second distributed oscillators.

16. The method of claim 15, wherein computing the set of error values for the first distributed oscillator comprises:
computing a first error value based on a first state value of the current set of state values and first state values for the second distributed oscillators;
computing a second error value based on a second state value of the current set of state values and second state values for the second distributed oscillators.

17. The method of claim 15, wherein the current set of state values for the first distributed oscillator comprises a current first state value and a current second state value, the set of error values comprises a first error value corresponding to the current first state value and a second error value corresponding to the current second state value, and computing the new set of state values comprises:
computing a new first state value based on the first error value, the current first state value, and the current second state value; and
computing a new second state value based on the second error value, the current first state value, and the current second state value.

18. The method of claim 15, wherein the new set of state values for the first distributed oscillator are computed based on the equation $x_i[n+1]=x_i[n]+\Delta t(f(x_1,x_2)+u_i[n])$, where $x_i[n+1]$ represents a new i-th state value for the first distributed oscillator, $x_i[n]$ represents a current i-th state value for the first distributed oscillator, Δt represents a discrete time step between computation of the current and new state values, $f(x_1,x_2)$ represents an oscillator function, and $u_i[n]=k_i e_i$, where $e_i$ represents the i-th error value and $k_i$ is a constant.

19. A multi-agent system, comprising:
a plurality of agents communicably coupled to at least one other agent in the multi-agent system, wherein each agent comprises a local distributed oscillator to:
obtain first and second state values for each distributed oscillator of the other agents in the multi-agent system, wherein the first state values correspond to a first local state value of the distributed oscillator, and the second state values correspond to a second local state value of the distributed oscillator;
compute a first error value based on the first local state value and the first state values for the distributed oscillators of the other agents in the multi-agent system;
compute a second error value based on the second local state value and the second state values for the distributed oscillators of the other agents in the multi-agent system;
compute a new first local state value for the distributed oscillator based on the first error value, the first local state value, and the second local state value;

compute a new second state value for the distributed oscillator based on the second error value, the first local state value, and the second local state value; and transmit the new first local state value and the new second local state value to the distributed oscillators of the other agents in the multi-agent system.

20. The multi-agent system of claim 19, wherein the distributed oscillator of each agent is to compute the new local state values based on the equation $x_i[n+1]=x_i[n]+\Delta t(f(x_1,x_2)+u_i[n])$, where $x_i[n+1]$ represents a new i-th local state value, $x_i[n]$ represents a current i-th local state value, $\Delta t$ represents a discrete time step between computation of the current and new local state values, $f(x_1,x_2)$ represents an oscillator function, and $u_i[n]=k_i e_i$ where $e_i$ represents the i-th error value and $k_i$ is a constant.

* * * * *